(12) United States Patent
Yoo

(10) Patent No.: US 11,362,139 B2
(45) Date of Patent: Jun. 14, 2022

(54) ELECTRONIC DEVICE AND METHOD OF MANUFACTURING THE SAME

(71) Applicant: SK hynix Inc., Icheon (KR)

(72) Inventor: Si Jung Yoo, Seoul (KR)

(73) Assignee: SK hynix Inc., Icheon (KR)

( * ) Notice: Subject to any disclaimer, the term of this patent is extended or adjusted under 35 U.S.C. 154(b) by 42 days.

(21) Appl. No.: 16/903,908

(22) Filed: Jun. 17, 2020

(65) Prior Publication Data

US 2021/0202576 A1 Jul. 1, 2021

(30) Foreign Application Priority Data

Dec. 26, 2019 (KR) .......................... 10-2019-0175654

(51) Int. Cl.
*H01L 27/24* (2006.01)
*G11C 13/00* (2006.01)
*H01L 45/00* (2006.01)
*G11C 5/02* (2006.01)

(52) U.S. Cl.
CPC .............. *H01L 27/24* (2013.01); *G11C 5/025* (2013.01); *G11C 13/0004* (2013.01); *H01L 45/06* (2013.01); *H01L 45/1233* (2013.01); *H01L 45/144* (2013.01)

(58) Field of Classification Search
CPC ....... H01L 27/24; H01L 45/06; H01L 45/144; H01L 45/1233; H01L 27/2463; H01L 27/222; H01L 45/12; H01L 43/02; H01L 27/22; G11C 5/025; G11C 13/0004; G11C 2213/30; G11C 13/0002; G11C 13/003; G11C 11/1659; G11C 2213/73; G11C 2213/79; G11C 2213/78; G11C 2213/71

See application file for complete search history.

(56) References Cited

U.S. PATENT DOCUMENTS

| 6,872,963 | B2 | 3/2005 | Kostylev et al. | |
|---|---|---|---|---|
| 10,249,683 | B1* | 4/2019 | Lille | H01L 45/1683 |
| 2012/0104351 | A1* | 5/2012 | Wei | H01L 45/1226 257/4 |
| 2014/0217349 | A1 | 8/2014 | Hopkins | |
| 2018/0315475 | A1 | 11/2018 | Redaelli et al. | |
| 2019/0267428 | A1* | 8/2019 | Wu | H01L 45/1226 |
| 2019/0296079 | A1* | 9/2019 | Murakami | H01L 27/11565 |

FOREIGN PATENT DOCUMENTS

KR 101482814 B1 1/2015

* cited by examiner

*Primary Examiner* — Jerome Leboeuf

(57) ABSTRACT

A semiconductor memory may include: variable resistance layers and insulating layers alternately stacked; conductive pillars passing through the variable resistance layers and the insulating layers; a slit insulating layer passing through the insulating layers and extending in a first direction; and conductive layers interposed between the slit insulating layer and the variable resistance layers. The variable resistance layers may remain in an amorphous state during a program operation.

18 Claims, 19 Drawing Sheets

ELECTRONIC DEVICE AND METHOD OF MANUFACTURING THE SAME

CROSS-REFERENCE TO RELATED APPLICATION

The present application claims priority under 35 U.S.C. § 119(a) to Korean patent application number 10-2019-0175654, filed on Dec. 26, 2019, in the Korean Intellectual Property Office, the entire disclosure of which is incorporated herein by reference.

BACKGROUND

1. Technical Field

Various embodiments of the present disclosure generally relate to an electronic device, and more particularly, to an electronic device including a semiconductor memory and a method of manufacturing the electronic device.

2. Related Art

Recently, with requirement of miniaturization, low power consumption, high performance, and diversification of electronic apparatuses, semiconductor devices configured to store information are needed in various electronic apparatuses such as computers and portable communication apparatuses. Therefore, there has been research on semiconductor devices configured to store data using characteristics of switching between different resistance phases depending on applied voltage or current. Examples of such semiconductor devices include a resistive random access memory (RRAM), a phase-change random access memory (PRAM), a ferroelectric random access memory (FRAM), a magnetic random access memory (MRAM), an E-fuse, and so forth.

SUMMARY

Various embodiments of the present disclosure are directed to an electronic device having improved operating characteristics and reliability of memory cells, and a method of manufacturing the electronic device.

An embodiment of the present disclosure may provide for an electronic device including a semiconductor memory. The semiconductor memory may include: variable resistance layers and insulating layers alternately stacked; conductive pillars passing through the variable resistance layers and the insulating layers; a slit insulating layer passing through the insulating layers and extending in a first direction; and conductive layers interposed between the slit insulating layer and the variable resistance layers. The variable resistance layers may remain in an amorphous state during a program operation.

An embodiment of the present disclosure may provide for an electronic device including a semiconductor memory. The semiconductor memory may include: insulating layers stacked; first variable resistance layers alternately stacked with the insulating layers and each extending in a first direction; vertical bit lines passing through the first variable resistance layers and the insulating layers; a first slit insulating layer passing through the insulating layers and extending in the first direction; a second slit insulating layer passing through the insulating layers and extending in the first direction; first word lines each interposed between the first slit insulating layer and each of the first variable resistance layers; and second word lines each interposed between the second slit insulating layer and each of the first variable resistance layers. First memory cells may be respectively disposed between the vertical bit lines and the first word lines, second memory cells may be respectively disposed between the vertical bit lines and the second word lines, and each of the first memory cells and each of the second memory cells are disposed adjacent in a second direction and share a corresponding one of the first variable resistance layers.

An embodiment of the present disclosure may provide for a method of manufacturing an electronic device including a semiconductor memory. The method may include: alternately forming first variable resistance layers and insulating layers; forming conductive pillars passing through the first variable resistance layers and the insulating layers; forming a slit passing through the first variable resistance layers and the insulating layers and extending in a first direction; forming openings by etching the first variable resistance layers exposed through the slit; and forming conductive layers in the respective openings.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Figure 1A:
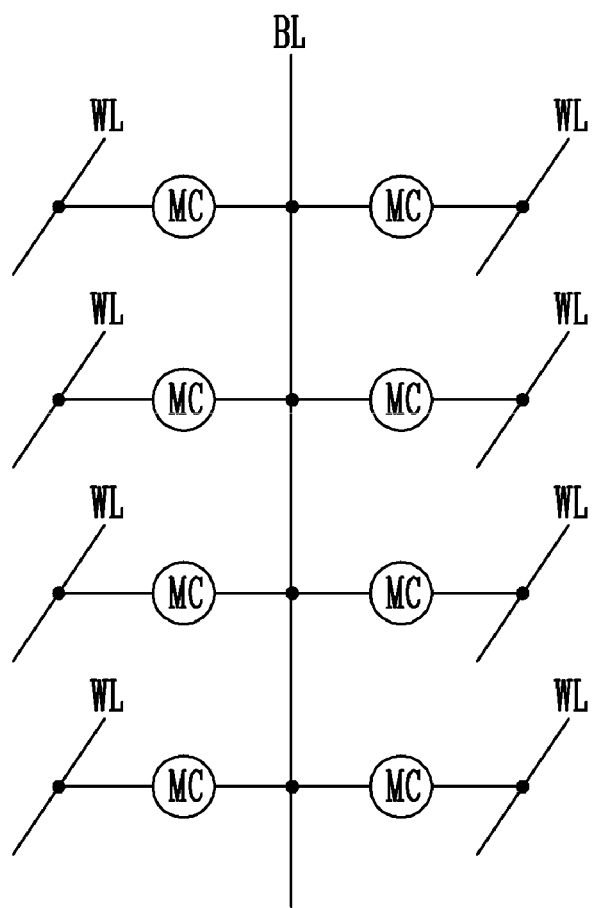
FIGS. 1A and 1B are diagrams for describing the structure of an electronic device in accordance with an embodiment of the present disclosure.
Figure 1B:
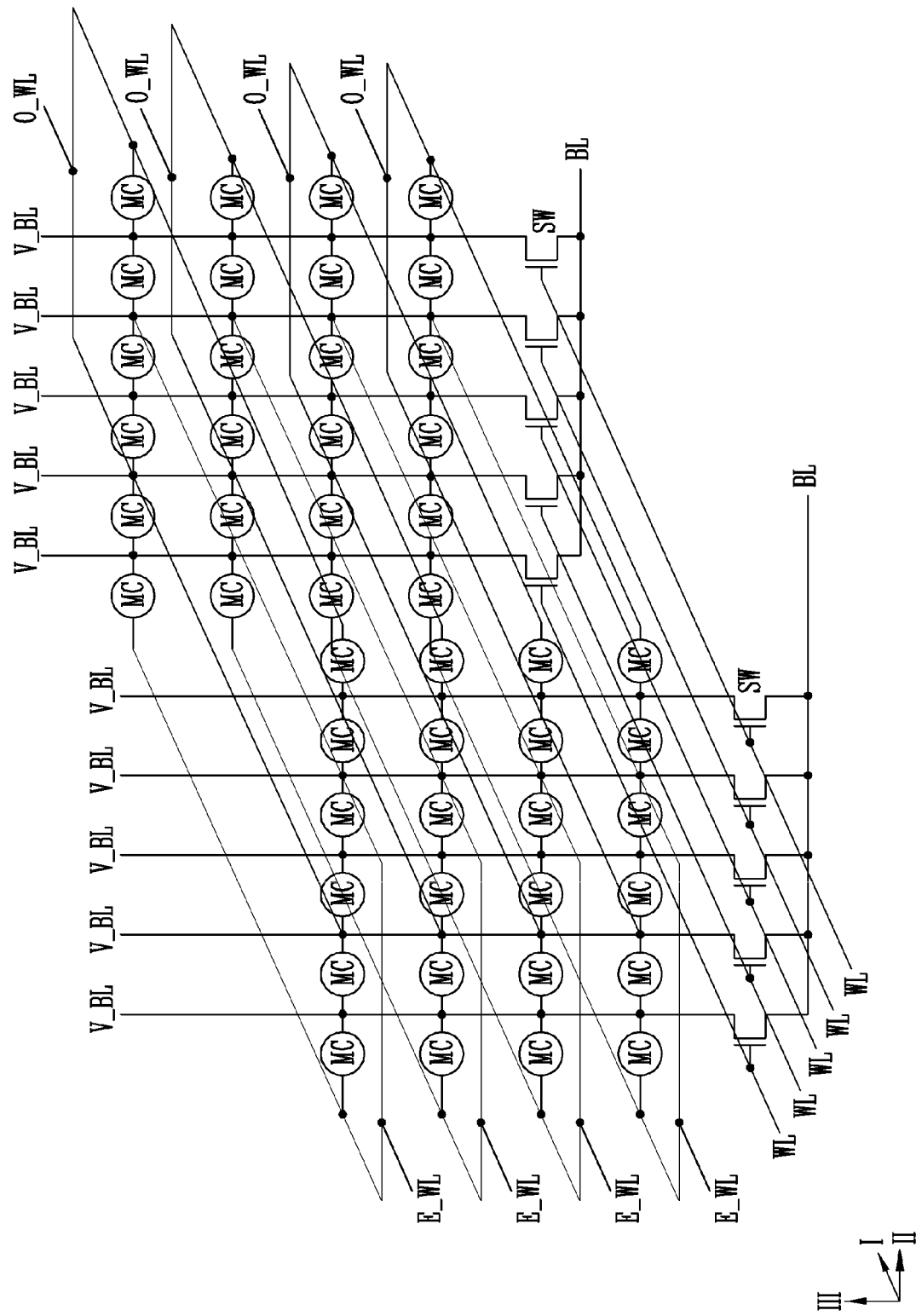

FIGS. 1A and 1B each illustrate a memory cell array of an electronic device in accordance with an embodiment of the present disclosure.

Referring to FIG. 1A, the electronic device in accordance with an embodiment of the present disclosure may include a semiconductor memory. The semiconductor memory may include word lines WL, and bit lines BL intersecting with the word lines WL. For reference, the notions of the terms "word lines WL" and "bit lines BL" may be relative to each other. Hence, the word lines WL may be bit lines, and the bit lines BL may be word lines.

The semiconductor memory may include memory cells MC coupled between the word lines WL and the bit lines BL. A plurality of memory cells MC may share one bit line BL. The memory cells MC that share the bit line BL may be respectively coupled to different word lines WL.

Each of the memory cells MC may include a memory element, a select element, or a memory element and a select element. Each of the memory cells MC may include a variable resistance layer. The variable resistance layer may have characteristics of making a reversible transition between different resistance states depending on voltage or current applied thereto. The variable resistance layer may be included in the memory element or the select element. Alternatively, the variable resistance layer may function as not only a memory element but also a select element.

The variable resistance layer may include resistance material. The variable resistance layer may include transition metal oxide, or metal oxide such as perovskite-based material. Hence, data may be stored in the memory cell MC by generating or removing an electrical path in the variable resistance layer.

The variable resistance layer may have an MTJ structure. The variable resistance layer may include a magnetization pinned layer, a magnetization free layer, and a tunnel barrier layer interposed therebetween. For example, the magnetization pinned layer and the magnetization free layer may include magnetic material. The tunnel barrier layer may include oxide such as magnesium (Mg), aluminum (Al), zinc (Zn), and titanium (Ti). Here, the magnetization direction of the magnetization free layer may change depending on spin torque of electrons in current applied thereto. Therefore, depending on a change in magnetization direction of the magnetization free layer with respect to the magnetization direction of the magnetization pinned layer, data may be stored in the memory cell MC.

The variable resistance layer may include phase-change material, and may include chalcogenide-based material. The variable resistance layer may include chalcogenide glass, a chalcogenide-based alloy, etc. The variable resistance layer may include silicon (Si), germanium (Ge), antimony (Sb), tellurium (Te), bismuth (Bi), indium (In), tin (Sn), selenium (Se), or a combination thereof. For example, the variable resistance layer may have a Ge—Sb—Te (GST) structure, and be formed of $Ge_2Sb_2Te_5$, $Ge_2Sb_2Te_7$, $Ge_1Sb_2Te_4$, or $Ge_1Sb_4Te_7$. The variable resistance layer may change in phase depending on a program operation. The variable resistance layer may have a low-resistance crystalline state by a set operation. The variable resistance layer may have a high-resistance amorphous state by a reset operation. Therefore, data may be stored in the memory cell MC by using a difference in resistance depending on the phase of the variable resistance layer.

The variable resistance layer may include variable resistance material which changes in resistance without a phase change, and may include chalcogenide-based material. The variable resistance layer may include germanium (Ge), antimony (Sb), tellurium (Te), arsenic (As), selenium (Se), silicon (Si), indium (In), tin (Sn), sulfur (S), gallium (Ga), or a combination thereof. The variable resistance layer may have one phase and retain the phase thereof during a program operation. For example, the variable resistance layer may have an amorphous state, and the phase thereof may not be changed into a crystalline state. Therefore, the threshold voltage of the memory cell MC may change depending on a program pulse applied to the memory cell MC, so that the memory cell MC may be programmed to at least two types of states. The variable resistance layer may have a high-resistance amorphous state by a reset operation, so that the memory cell MC may be programmed to a reset state having a high threshold voltage. The variable resistance layer may have a low-resistance amorphous state by a set operation, so that the memory cell MC may be programmed to a set state having a low threshold voltage.

Referring to FIG. 1B, the semiconductor memory may include odd word lines O_WL, even word lines E_WL, vertical bit lines V_BL, and memory cells MC. The odd word lines O_WL and the even word lines E_WL each may extend in a first direction I.

The vertical bit lines V_BL may each extend in a third direction III. The memory cells MC that are coupled between the vertical bit lines V_BL and the odd word lines O_WL may be referred to as odd memory cells. The memory cells MC that are coupled between the vertical bit lines V_BL and the even word lines E_WL may be referred to as even memory cells. An even memory cell and an odd memory cell that are disposed in the same level with respect to the third direction III and are adjacent to each other in a second direction II may share an identical vertical bit line V_BL. Even memory cells that are disposed in the same level with respect to the third direction III and are adjacent to each other in the first direction I may share an identical even word line E_WL. Odd memory cells that are disposed in the same level with respect to the third direction III and are adjacent to each other in the first direction I may share an identical odd word line O_WL. Here, the second direction II may be a direction intersecting with the first direction I. Here, the third direction III may be a direction intersecting with the first direction I and the second direction II. For example, the third direction III may be a direction perpendicular to a plane defined by the first direction I and the second direction II.

The semiconductor memory may further include switches SW for selecting the vertical bit lines V_BL. Connection between the vertical bit lines V_BL and the bit lines BL may be controlled by the switches SW. The switches SW may include a transistor, a vertical transistor, a diode, etc. In addition, the semiconductor memory may include word lines WL for selectively driving the switches SW.

The word lines WL and the bit lines BL may be used to select a switch SW. One word line WL may be selected from the plurality of word lines WL, and one bit line BL may be selected from the plurality of bit lines BL. Thereby, one switch SW may be selected from the plurality of switches SW.

The switches SW may be used to select a vertical bit line V_BL. When the selected switch SW is turned on, the corresponding bit line BL may be coupled with the corresponding vertical bit line V_BL. Hence, one vertical bit line V_BL may be selected from the plurality of vertical bit lines V_BL. Furthermore, one odd word line O_WL may be selected from the plurality of odd word lines O_WL or one even word line E_WL may be selected from the plurality of even word lines E_WL. Thereby, a memory cell MC coupled between the selected vertical bit line V_BL and the selected word line O_WL or E_WL may be selected.

Figure 2A:
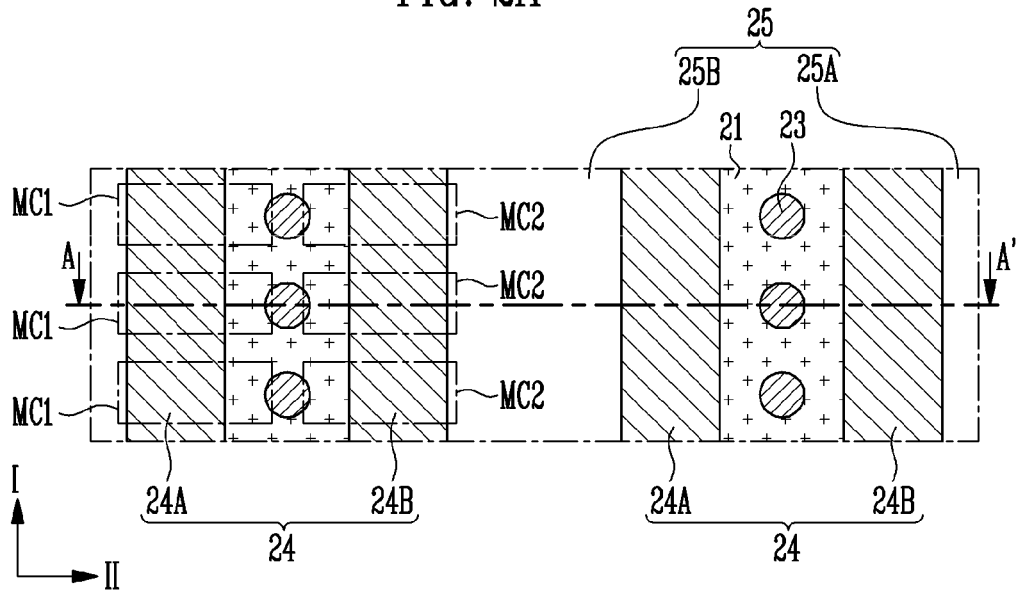
FIGS. 2A and 2B are diagrams illustrating the structure of a semiconductor device in accordance with an embodiment of the present disclosure.
Figure 2B:
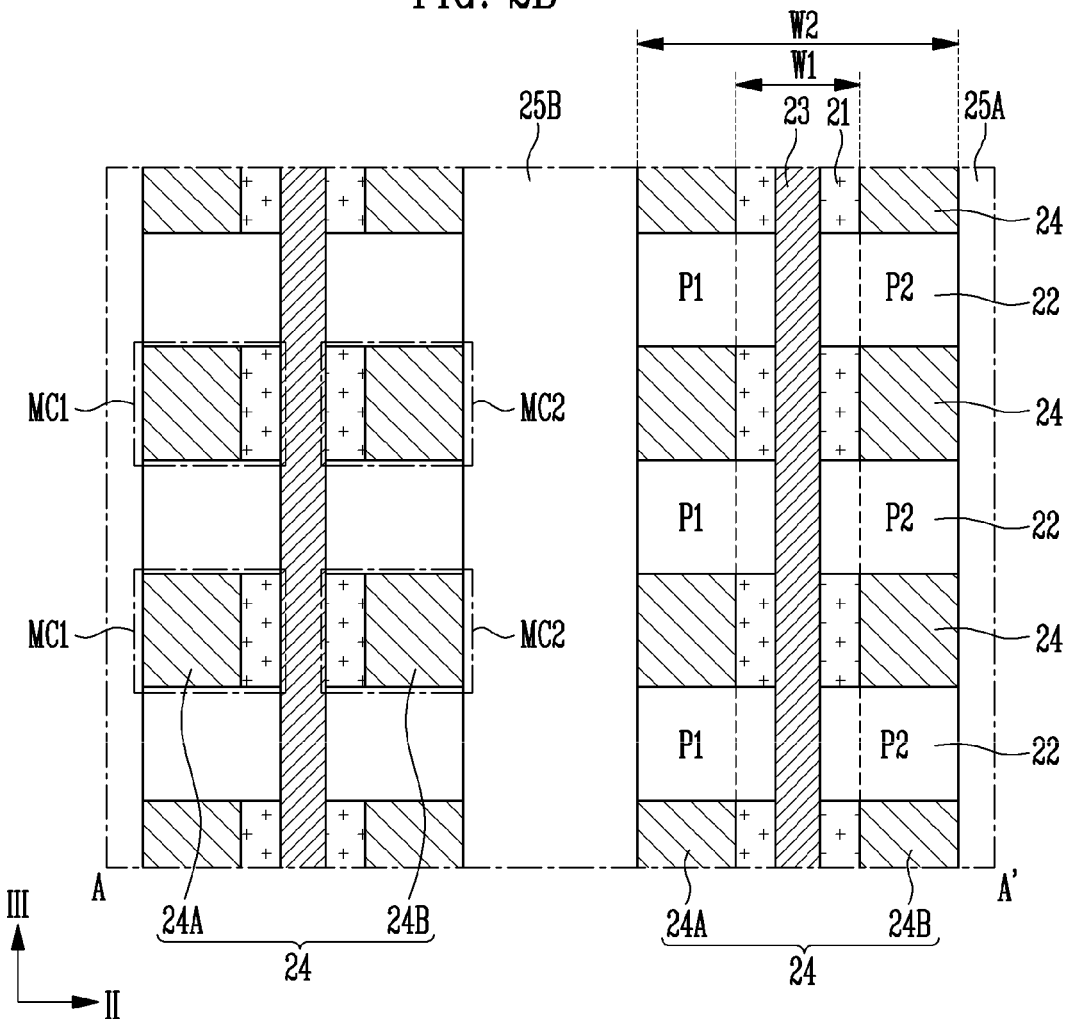

FIGS. 2A and 2B are diagrams illustrating the structure of a semiconductor device in accordance with an embodiment of the present disclosure. FIG. 2A illustrates a plan view, and FIG. 2B illustrates a cross section taken along a line A-A' in the second direction II of FIG. 2A. Hereinbelow, repetitive explanation will be omitted for the interest of brevity.

Referring to FIGS. 2A and 2B, the semiconductor device may include variable resistance layers 21, insulating layers 22, conductive pillars 23, conductive layers 24, and a slit insulating layer 25.

The variable resistance layers 21 and the insulating layers 22 are alternately stacked. The variable resistance layers 21 and the insulating layers 22 may enclose sidewalls of the conductive pillars 23 and be stacked in the third direction III. The variable resistance layers 21 may have characteristics of making a reversible transition between different resistance states depending on voltage or current applied thereto. The variable resistance layers 21 may include resistance material, phase-change material, variable resistance material, an MTJ structure, chalcogenide material, etc. The insulating layers 22 may be provided to separate the stacked variable resistance layers 21 from each other. The insulating layers 22 may include insulating material such as oxide or nitride.

Each variable resistance layer 21 and each insulating layer 22 may have different widths in the second direction II. Each of the variable resistance layers 21 may have a first width W1. Each of the insulating layers 22 may have a second width W2. For example, each of the insulating layers 22 may have the second width W2 greater than that W1 of the variable resistance layers 21. The insulating layers 22 may protrude in the second direction II compared to the variable resistance layers 21. For example, a second portion (e.g., a right portion) of the insulating layer 22 may protrude farther from the conductive pillar 23 than a second portion (e.g., a right portion) of the variable resistance layer 21 in the second direction II, the second portion of the insulating layer 22 and the second portion of the variable resistance layer 21 being disposed adjacent to each other in the third direction III. A first portion (e.g., a left portion) of the insulating layer 22 may protrude farther from the conductive pillar 23 than a first portion (e.g., a left portion) of the variable resistance layer 21 in a direction opposite to the second direction II, the first portion of the insulating layer 22 and the first portion of the second variable resistance layer 21 being disposed adjacent to each other in the third direction III. Portions of each insulating layer 22 that protrude compared to the variable resistance layer 21, in other words, portions of the insulating layer 22 that do not overlap with the variable resistance layer 21 with respect to the third direction III, may be defined as protrusions. For example, a portion of the insulating layer 22 may protrude compared to a variable resistance layer 21 such that the portion of the insulating layer 22 protrudes from the variable resistance layer 21 in a cross-sectional view, and the portion of the insulating layer 22 may be referred to as a protrusion. Each of the insulating layers 22 may include a first protrusion P1 and a second protrusion P2. The first protrusion P1 may protrude compared to a first sidewall of the variable resistance layer 21. The second protrusion P2 may protrude compared to a second sidewall of the variable resistance layer 21. For example, the first protrusion P1 may protrude from the first sidewall of the variable resistance layer 21 and the second protrusion P2 may protrude from the second sidewall of the variable resistance layer 21, in a cross-sectional view.

The slit insulating layer 25 may pass through the insulating layers 22 and extend in the first direction I. The slit insulating layers 25 may include insulating material such as oxide or nitride.

The conductive pillars 23 each may extend in the third direction III and pass through the variable resistance layers 21 and the insulating layers 22. The conductive pillars 23 may be arranged in the first direction I and the second direction II. The conductive pillars 23 that are arranged in the first direction I may form one pillar column. Each variable resistance layer 21 may enclose the sidewalls of the conductive pillars 23 belonging to a corresponding identical pillar column and extend in the first direction I. For example, each of the variable resistance layer 21 may extend in the first direction I and have a plurality of inner surfaces that respectively enclose a plurality of portions of the sidewalls of the conductive pillars 23 arranged in the first direction I. Therefore, the variable resistance layer 21 may be interposed between the conductive pillars 23 that are adjacent to each other in the first direction I. In other words, a plurality of portions of the variable resistance layer 21 each may be interposed between a pair of the conductive pillars 23 that are adjacent to each other in the first direction I, thereby filling spaces between the conductive pillars 23. The conductive pillars 23 may be bit lines or vertical bit lines.

The conductive layers 24 may be interposed between the slit insulating layer 25 and the variable resistance layers 21. Therefore, the variable resistance layer 21 may be interposed between the conductive layers 24 that are adjacent to each other in the second direction II. The conductive layers 24 may be disposed in the same level as that of the variable resistance layers 21. For example, with respect to the orientation of FIG. 2B, a top surface of a conductive layer 24 may be substantially coplanar with a top surface of a corresponding variable resistance layer 21, or a bottom surface of the conductive layer 24 may be substantially coplanar with a bottom surface of the corresponding variable resistance layer 21, or both. The conductive layers 24 may be disposed between the protrusions P1 and P2 that are adjacent to each other in the third direction III. For example, a conductive layer 24 may be disposed between a first pair of protrusions P1 and P2 and a second pair of protrusions P1 and P2, the first pair being disposed adjacent to the second pair in the third direction III. The conductive layers 24 and the protrusions P1 and P2 may be alternately stacked.

Each of the conductive layers 24 may be a word line, in detail, an odd word line or an even word line. The conductive layer 24 that is disposed on a first side (e.g., a left side) of the variable resistance layer 21 may be a first word line 24A. The conductive layer 24 that is disposed on a second side (e.g., a right side) of the variable resistance layer 21 may be a second word line 24B. For example, the second word line 24B may be interposed between a first slit insulating layer 25A and the variable resistance layer 21. In addition, the first word line 24A may be interposed between a second slit insulating layer 25B disposed adjacent to the first slit insulating layer 25A in the second direction II and the variable resistance layer 21. The first word line 24A may be an even word line, and the second word line 24B may be an odd word line. Alternatively, the first word line 24A may be an odd word line, and the second word line 24B may be an even word line.

For reference, although not illustrated, electrode layers may be respectively interposed between the conductive pillars 23 and the variable resistance layers 21 or between the variable resistance layers 21 and the conductive layers 24. In addition, although not illustrated, electrode layers may be respectively interposed between the conductive pillars 23 and the variable resistance layers 21 and between the variable resistance layers 21 and the conductive layers 24.

According to the above-mentioned structure, memory cells MC1 and MC2 may be disposed in areas in which the conductive pillars 23 and the conductive layers 24 intersect with each other. Each of the memory cells MC1 and MC2 may include the conductive layer 24, the variable resistance layer 21, and the conductive pillar 23.

The first memory cells MC1 may be disposed in areas in which the conductive pillars 23 and the first word lines 24A intersect with each other. The second memory cells MC2 may be disposed in areas in which the conductive pillars 23 and the second word lines 24B intersect with each other. The first memory cells MC1 may be arranged in the first direction I. The first memory cells MC1 that are disposed in the same level may share the variable resistance layer 21 and the first word line 24A. The second memory cells MC2 may be arranged in the first direction I. The second memory cells MC2 that are disposed in the same level may share the variable resistance layer 21 and the second word line 24B. Furthermore, the first memory cell MC1 and the second memory cell MC2 that are adjacent to each other in the second direction II may share the variable resistance layer 21 and the conductive pillars 23 whereas the first and second memory cells MC1 and MC2 may be respectively coupled to different word lines 24A and 24B.

In an embodiment, the variable resistance layers 21 may include amorphous chalcogenide. The amorphous chalcogenide may have resistance corresponding to that of insulating material under a threshold electric field value. Hence, even if the memory cells MC1 and MC2 share the variable resistance layer 21, a program operation may be selectively performed. In a selected memory cell, an electric field having an electric field value greater than the threshold electric field value may be formed in the variable resistance layer 21, and a memory operation may be operated in the corresponding area. On the other hand, in the case of unselected memory cells, an electric field having an electric field value equal to or less than the threshold electric field value is formed in the variable resistance layer 21. Therefore, the variable resistance layer 21 may have insulating characteristics. Consequently, leakage current may be prevented from occurring in the unselected memory cells.

Figure 3A:
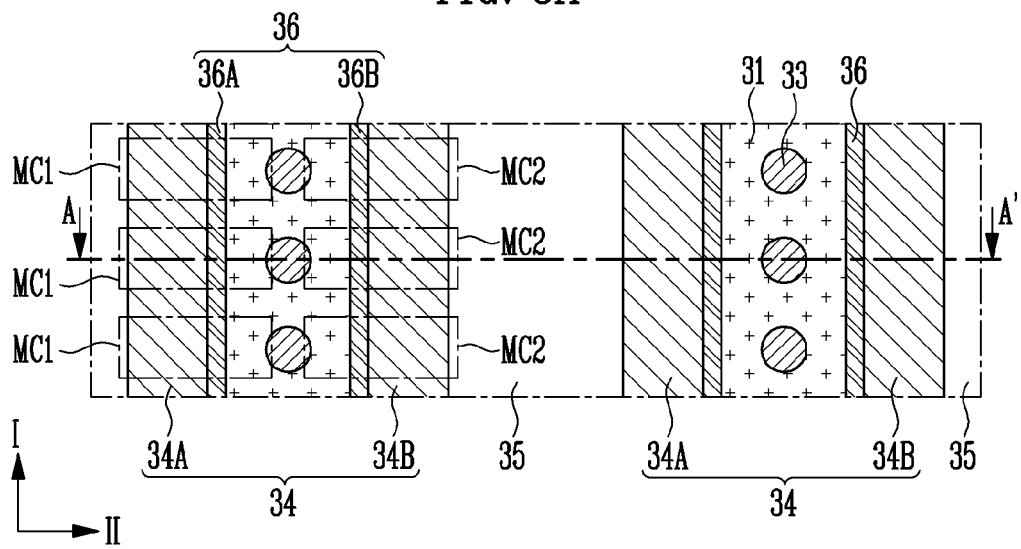
FIGS. 3A and 3B are diagrams illustrating the structure of a semiconductor device in accordance with an embodiment of the present disclosure.
Figure 3B:
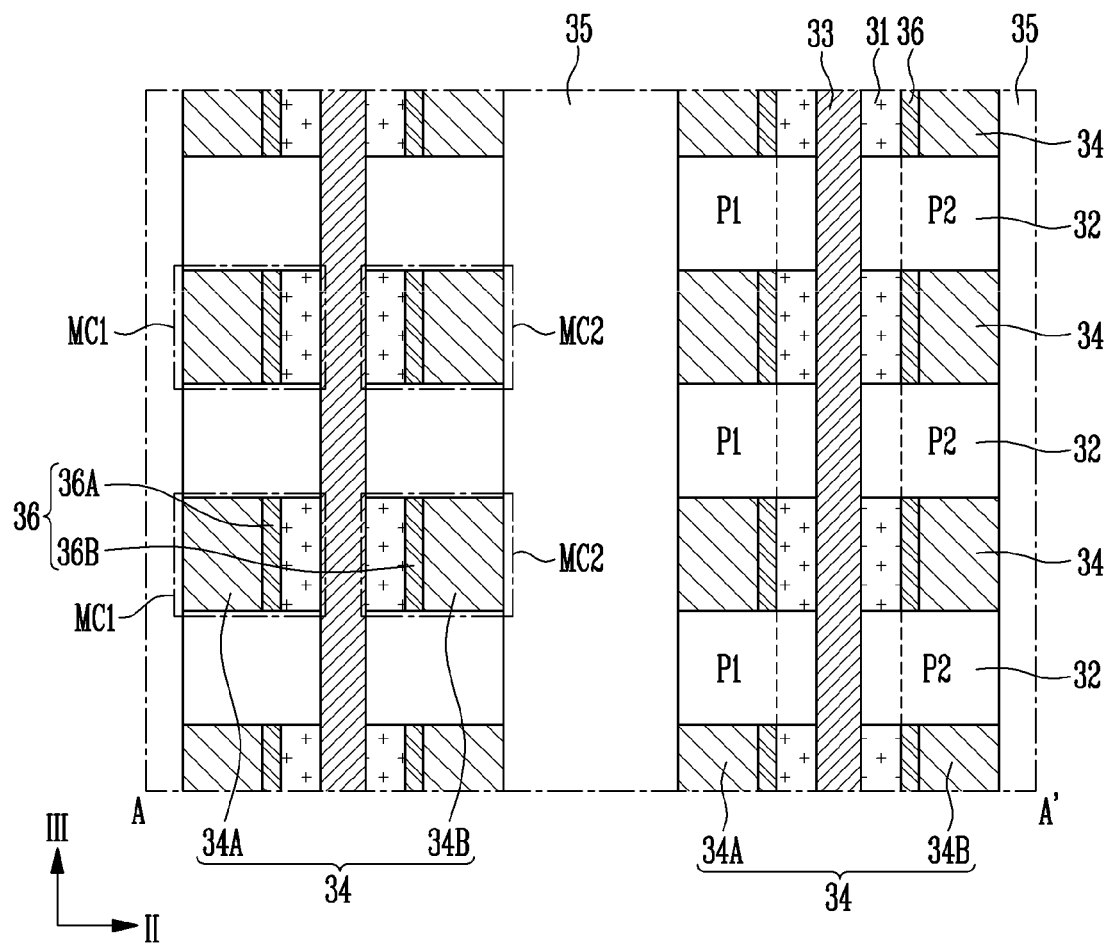

FIGS. 3A and 3B are diagrams illustrating the structure of a semiconductor device in accordance with an embodiment of the present disclosure. FIG. 3A illustrates a plan view, and FIG. 3B illustrates a cross section taken along a line A-A' in the second direction II of FIG. 3A. Hereinbelow, repetitive explanation will be omitted for the interest of brevity.

Referring to FIGS. 3A and 3B, the semiconductor device may include first variable resistance layers 31, second variable resistance layers (e.g., phase-change layers) 36, insulating layers 32, conductive pillars 33, conductive layers 34, and a slit insulating layer 35.

The first variable resistance layers 31 and the insulating layers 32 are alternately stacked. Each of the insulating layers 32 may have a width greater than that of each of the first variable resistance layers 31. For example, each of the insulating layers 32 may have a width in a second direction II greater than that of each of the first variable resistance layers 31. The insulating layers 32 may protrude in the second direction II compared to the first variable resistance layers 31. For example, a second portion (e.g., a right portion) of the insulating layer 32 may protrude farther from the conductive pillar 33 than a second portion (e.g., a right portion) of the first variable resistance layer 31 in the second direction II, the second portion of the insulating layer 32 and the second portion of the first variable resistance layer 31 being disposed adjacent to each other in the third direction III. A first portion (e.g., a left portion) of the insulating layer 32 may protrude farther from the conductive pillar 33 than a first portion (e.g., a left portion) of the first variable resistance layer 31 in a direction opposite to the second direction II, the first portion of the insulating layer 32 and the first portion of the first variable resistance layer 31 being disposed adjacent to each other in the third direction III. Each of the insulating layers 32 may include a first protrusion P1 and a second protrusion P2. The first protrusion P1 may protrude compared to a first sidewall of the first variable resistance layer 31. The second protrusion P2 may protrude compared to a second sidewall of the first variable resistance layer 31. For example, the first protrusion P1 may protrude from the first sidewall of the first variable resistance layer 31 and the second protrusion P2 may protrude from the second sidewall of the first variable resistance layer 31, in a cross-sectional view.

The conductive pillars 33 each may extend in the third direction III and pass through the first variable resistance layers 31 and the insulating layers 32. Each first variable resistance layer 31 may enclose the sidewalls of the conductive pillars 33 belonging to a corresponding identical pillar column and extend in the first direction I. For example, each of the first variable resistance layer 31 may extend in the first direction I and have a plurality of inner surfaces that respectively enclose a plurality of portions of the sidewalls of the conductive pillars 33 arranged in the first direction I. Therefore, the first variable resistance layer 31 may be interposed between the conductive pillars 33 that are adjacent to each other in the first direction I. The conductive pillars 33 may be bit lines or vertical bit lines.

The slit insulating layer 35 may pass through the insulating layers 32 and extend in the first direction I. The conductive layers 34 may be interposed between the slit insulating layer 35 and the first variable resistance layers 31. The second variable resistance layers 36 may be interposed between the first variable resistance layers 31 and the conductive layers 34.

The first variable resistance layers 31, the second variable resistance layers 36, and the conductive layers 34 may be disposed in substantially the same level. The second variable resistance layers 36 and the conductive layers 34 may be disposed between the protrusions P1 and P2 that are adjacent to each other in the third direction III. The second variable resistance layers 36 and the conductive layers 34 may be alternately stacked with the protrusions P1 and P2 in the third direction III.

Each of the conductive layers 34 may be a word line, in detail, an odd word line or an even word line. The first word lines 34A may be alternately stacked with the first protrusions P1. The second word lines 34B may be alternately stacked with the second protrusions P2.

The first variable resistance layers 31 and the second variable resistance layers 36 may have characteristics of making a reversible transition between different resistance states depending on voltage or current applied thereto. The first variable resistance layers 31 and the second variable resistance layers 36 may include resistance material, phase-change material, variable resistance material, an MTJ structure, chalcogenide material, etc. In an embodiment, the first variable resistance layers 31 may include chalcogenide and remain in an amorphous state during a program operation. The second variable resistance layers 36 may include phase-change material. In an embodiment, the second variable resistance layers 36 may include chalcogenide and be phase-changed into an amorphous state or a crystalline state during the program operation.

For reference, although not illustrated, electrode layers may be respectively interposed between the conductive pillars 33 and the first variable resistance layers 31, or between the first variable resistance layers 31 and the second variable resistance layers 36, or between the second variable resistance layers 36 and the conductive layers 34. Alternatively, electrode layers may be provided on at least some of interfaces of the conductive pillars 33, the first variable resistance layer 31, the second variable resistance layer 36, and the conductive layer 34. For example, electrode layers may be provided on two or more of a first interface between a conductive pillar 33 and a first variable resistance layer 31, a second interface between the first variable resistance layer 31 and a second variable resistance layer 36, and a third interface between the second variable resistance layer 36 and the conductive layer 34.

According to the above-mentioned structure, memory cells MC1 and MC2 may be disposed in areas in which the conductive pillars 33 and the conductive layers 34 intersect with each other. Each of the memory cells MC1 and MC2 may include the conductive layer 34, the first variable resistance layer 31, the second variable resistance layer 36, and the conductive pillar 33. The first memory cell MC1 and the second memory cell MC2 that are adjacent to each other in the second direction II may share the first variable resistance layer 31, and each may include the second variable resistance layer 36. The first variable resistance layer 31 may be interposed between a second variable resistance layer 36A of the first memory cell MC1 and a second variable resistance layer 36B of the second memory cell MC2, so that the second variable resistance layer 36A and the second variable resistance layer 36B may be separated from each other. Here, the first variable resistance layer 31 may function as a select element. The second variable resistance layer 36 may function as a memory element.

Figure 4A:
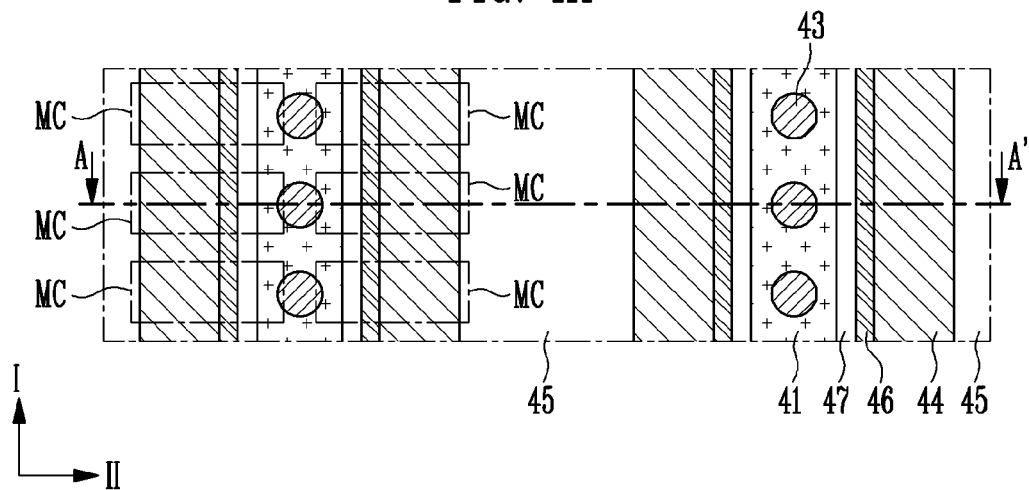
FIGS. 4A and 4B are diagrams illustrating the structure of a semiconductor device in accordance with an embodiment of the present disclosure.
Figure 4B:
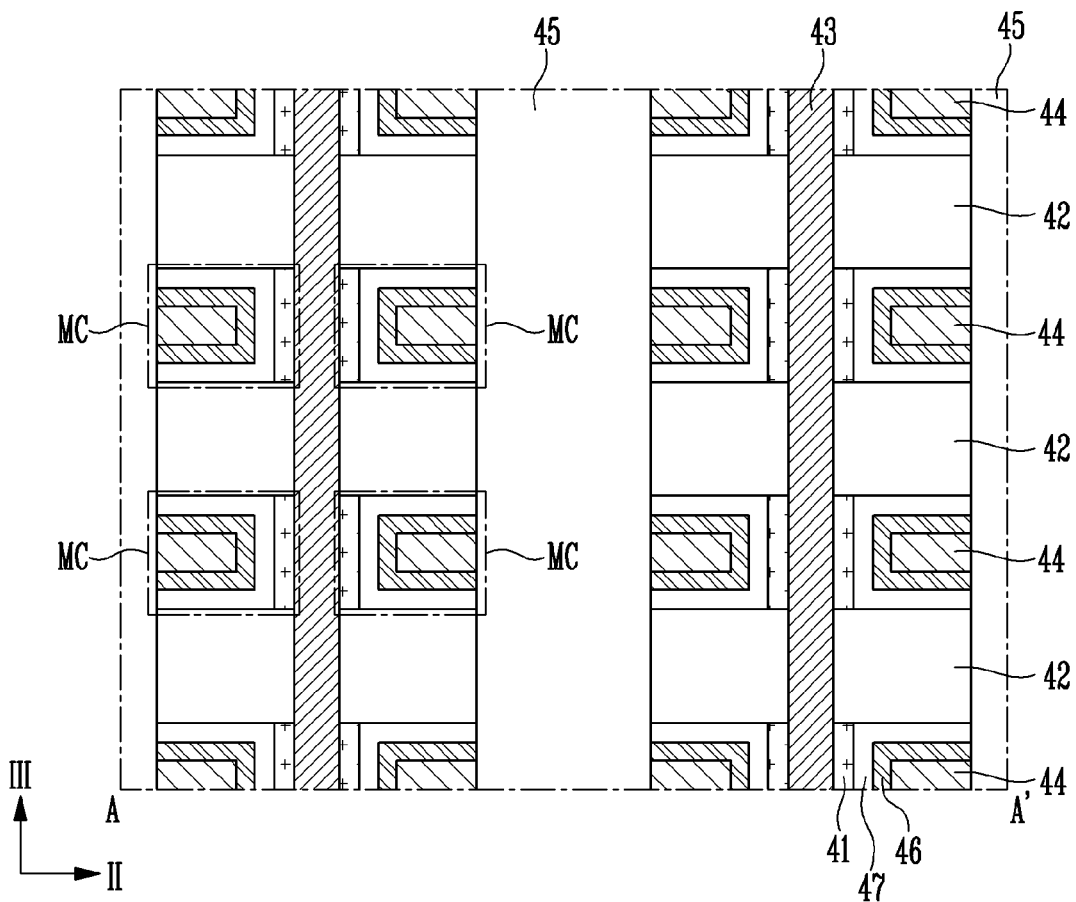

FIGS. 4A and 4B are diagrams illustrating the structure of a semiconductor device in accordance with an embodiment of the present disclosure. FIG. 4A illustrates a plan view, and FIG. 4B illustrates a cross section taken along a line A-A' in the second direction II of FIG. 4A. Hereinbelow, repetitive explanation will be omitted for the interest of brevity.

Referring to FIGS. 4A and 4B, the semiconductor device may include first variable resistance layers 41, second variable resistance layers 46, insulating layers 42, conductive pillars 43, electrode layers 47, conductive layers 44, and a slit insulating layer 45.

The first variable resistance layers 41 and the insulating layers 42 are alternately stacked. The conductive pillars 43 may extend in the third direction III and pass through the first variable resistance layers 41 and the insulating layers 42. The slit insulating layer 45 may pass through the insulating layers 42 and extend in the first direction I.

The conductive layers 44 may be interposed between the slit insulating layer 45 and the first variable resistance layers 41. Each of the conductive layers 44 may be a word line, in detail, an odd word line or an even word line. The second variable resistance layers 46 may be interposed between the first variable resistance layers 41 and the conductive layers 44. The second variable resistance layers 46 may extend between the conductive layers 44 and the insulating layers 42, and each may have a C-shaped cross-section. For example, a second variable resistance layer 46 may have a first portion extending in the second direction II, a second portion extending in the section direction II and spaced apart from the first portion by a given distance in the third direction III, and a third portion connecting the first portion and the second portion, each of the first portion and the second portion being disposed between a conductive layer 44 and an insulating layer 42. The electrode layers 47 may be interposed between the first variable resistance layers 41 and the second variable resistance layers 46. The electrode layers 47 may extend between the conductive layers 44 and the insulating layers 42, and each may have a C-shaped cross-section. For example, each C-shaped second variable resistance layer 46 may be formed in the corresponding C-shaped electrode layer 47. Each electrode layer 44 may be formed in the corresponding C-shaped second variable resistance layer 46.

Each of the electrode layers 47 may include tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pd), platinum (Pt), or a combination thereof. For example, each of the electrode layers 47 may be a carbon electrode.

For reference, although not illustrated, additional electrode layers may be interposed between the conductive pillars 43 and the first variable resistance layers 41 or between the second variable resistance layers 46 and the conductive layers 44. Alternatively, additional electrode layers may be interposed between the conductive pillars 43 and the first variable resistance layers 41 and between the second variable resistance layers 46 and the conductive layers 44.

According to the above-mentioned structure, memory cells MC may be disposed in areas in which the conductive pillars 43 and the conductive layers 44 intersect with each other. Each of the memory cells MC1 and MC2 may include the conductive pillar 43, the first variable resistance layer 41, the electrode layers 47, the second variable resistance layer 46, and the conductive layer 44.

Figure 5A:
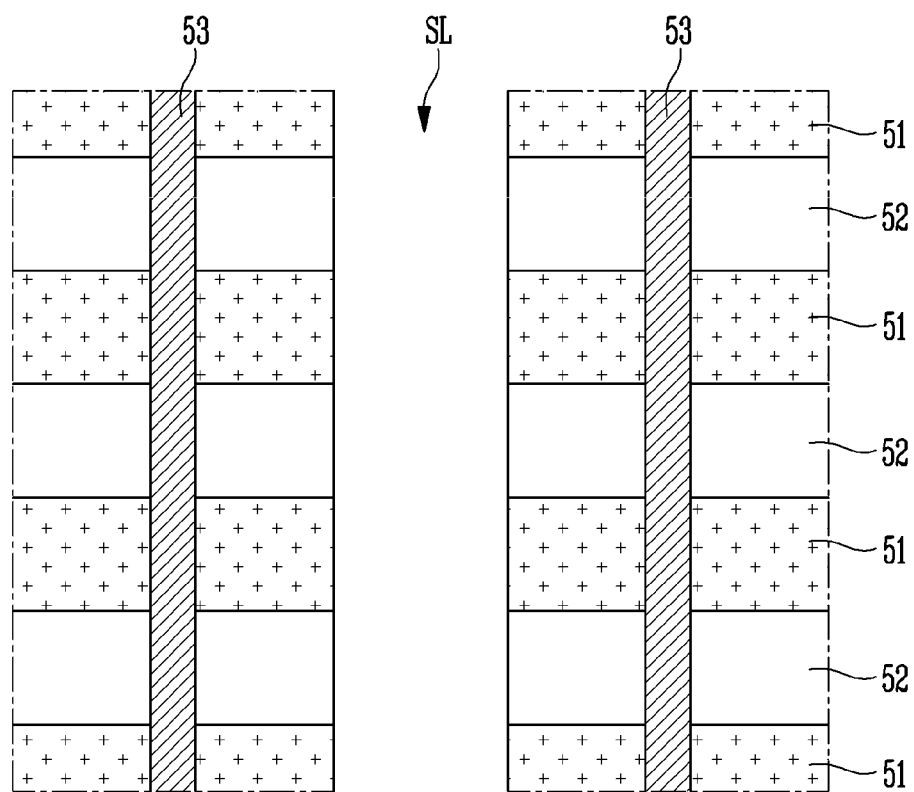
FIGS. 5A, 5B, and 5C are diagrams illustrating a method of manufacturing an electronic device in accordance with an embodiment of the present disclosure.
Figure 5B:
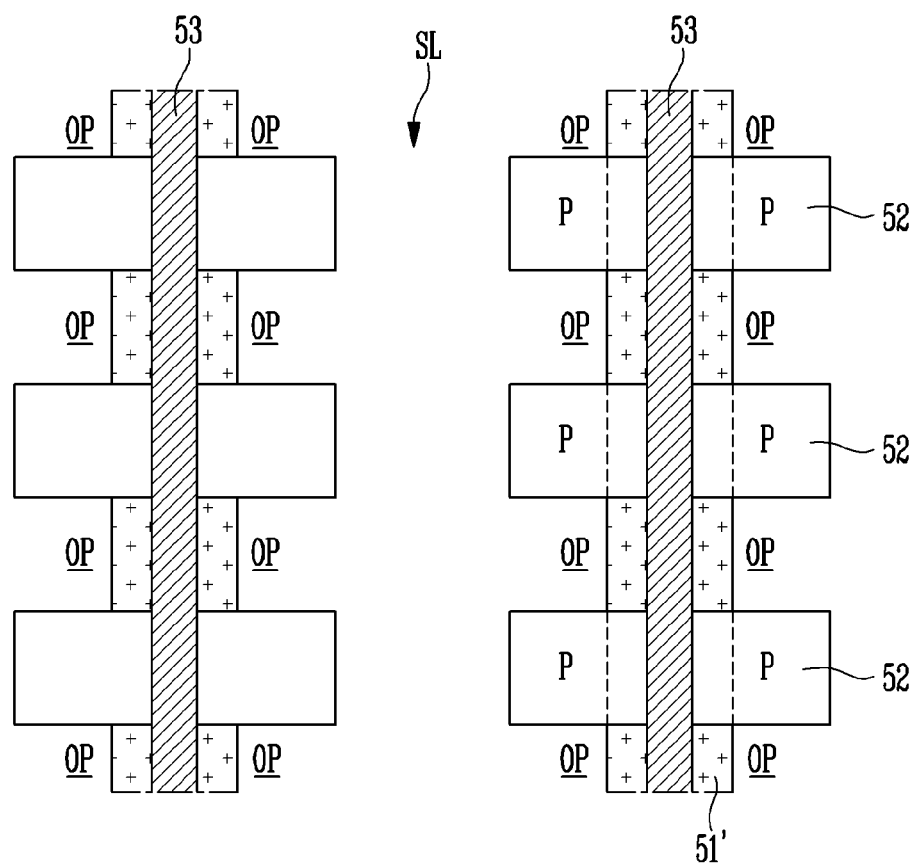
Figure 5C:
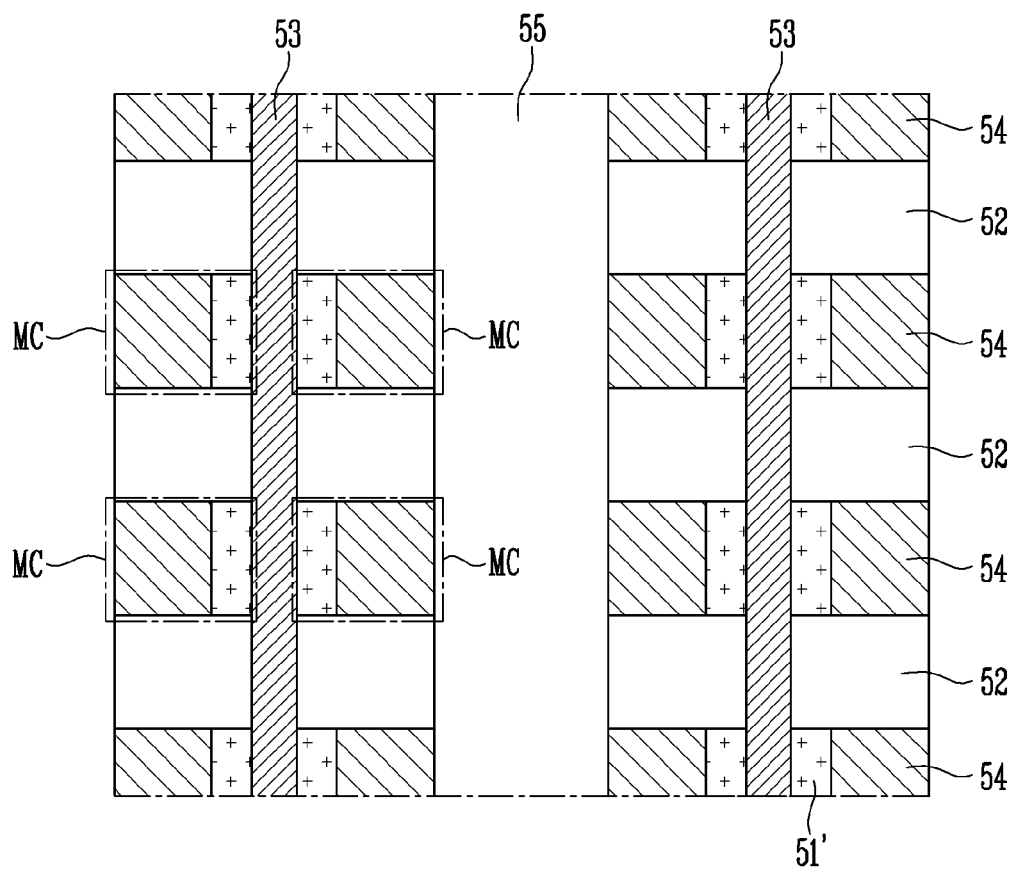

FIGS. 5A, 5B, and 5C are diagrams illustrating a method of manufacturing an electronic device in accordance with an embodiment of the present disclosure. Hereinbelow, repetitive explanation will be omitted for the interest of brevity.

Referring to FIG. 5A, variable resistance layers 51 and insulating layers 52 may be alternately stacked. The variable resistance layers 51 may include one or more materials having characteristics of making a reversible transition between different resistance states depending on voltage or current applied thereto. The variable resistance layers 51 may include resistance material, phase-change material, variable resistance material, an MTJ structure, chalcogenide material, etc. For example, each of the variable resistance layers 51 may include an amorphous chalcogenide layer. Each of the insulating layers 52 may include an oxide layer, a nitride layer, etc.

Thereafter, conductive pillars 53 passing through the variable resistance layers 51 and the insulating layers 52 may be formed. The conductive pillars 53 may be bit lines or vertical bit lines. Thereafter, a slit SL passing through the variable resistance layers 51 and the insulating layers 52 may be formed. The slit SL may be disposed between adjacent conductive pillars 53 and extend in one direction. For example, the slit SL may be disposed between conductive pillars 53 that are adjacent in a second direction (e.g., the horizontal direction in FIG. 5A) and extend in a third direction (e.g., the vertical direction in FIG. 5A) intersecting the second direction. The slit SL may further extend in a first direction that is perpendicular to the plane defined by the second and third directions.

Referring to FIG. 5B, openings OP may be formed by removing portions of the variable resistance layers 51 through the slit SL. The openings OP may be formed by etching the respective portions of the variable resistance layers 51 to a predetermined depth from the slit SL. The openings OP may be formed by selectively etching the variable resistance layers 51. Therefore, each of the insulating layers 52 may have a width greater than that of each of the remaining variable resistance layers 51'. Each of the insulating layers 52 may include a protrusion P that protrudes compared to the variable resistance layers 51'. The openings OP may be disposed between the protrusions P and extend in one direction. For example, each of the openings OP may be disposed between a pair of protrusions P adjacent in the third direction (e.g., the vertical direction in FIG. 5B) and extend in the second direction (e.g., the horizontal direction in FIG. 5B). Each of the openings OP may further extend in the first direction that is perpendicular to the plane defined by the second and third directions.

Referring to FIG. 5C, conductive layers 54 may be formed in the respective openings OP. For example, conductive material may be formed in the openings and the slit SL. The conductive material may be formed to have a thickness such that the openings OP are substantially completely filled with the conductive material whereas the slit SL is not completely filled with the conductive material. Subsequently, the conductive material may be removed from the slit SL. Thereby, the conductive layers 54 that are separated from each other may be formed. Each of the conductive layers 54 may be a word line, in detail, an odd word line or an even word line. The conductive layers 54 may include polysilicon, or metal such as tungsten. Thereafter, a slit insulating layer 55 may be formed in the slit SL.

As a result, memory cells MC may be formed in areas in which the conductive pillars 53 and the conductive layers 54 intersect with each other. Each of the memory cells MC may include the conductive pillar 53, the variable resistance layer 51, and the conductive layer 54.

According to the above-mentioned manufacturing method, the variable resistance layers 51 and the insulating layers 52 may be alternately formed. Subsequently, the variable resistance layers 51 are selectively etched and the remaining variable resistance layers 51' may function as a memory element, or a select element, or both in a memory cell MC. In a conventional technique, a plurality of openings may be formed and then a material may be deposited over the plurality of openings to form variable resistance layers therein. Thus, a deposition method with a good step coverage is required for the conventional technique to form the variable resistance layers in the plurality of openings. Compared to the conventional technique in which the variable resistance layers are formed in the openings, a deposition process for the variable resistance layers 51 may be simplified. For example, an evaporation scheme, such as physical vapor deposition (PVD) scheme, having a relatively poor step coverage may be used to form the variable resistance layers 51. Thus, evaporation of multi-component material such as chalcogenide may be facilitated, and formation of a chalcogenide layer may be easily controlled. In addition, a memory cell MC, which includes the remaining variable resistance layer 51' including amorphous chalcogenide and functions as not only a memory element but also a select element, may be implemented.

Figure 6A:
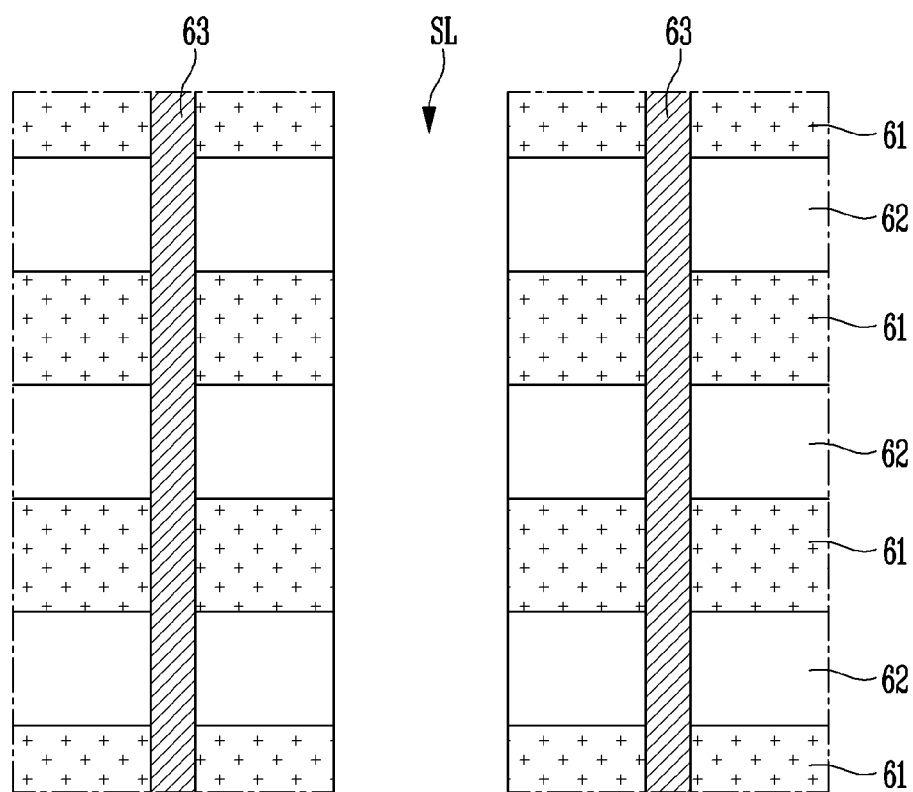
FIGS. 6A, 6B, and 6C are diagrams illustrating a method of manufacturing an electronic device in accordance with an embodiment of the present disclosure.
Figure 6B:
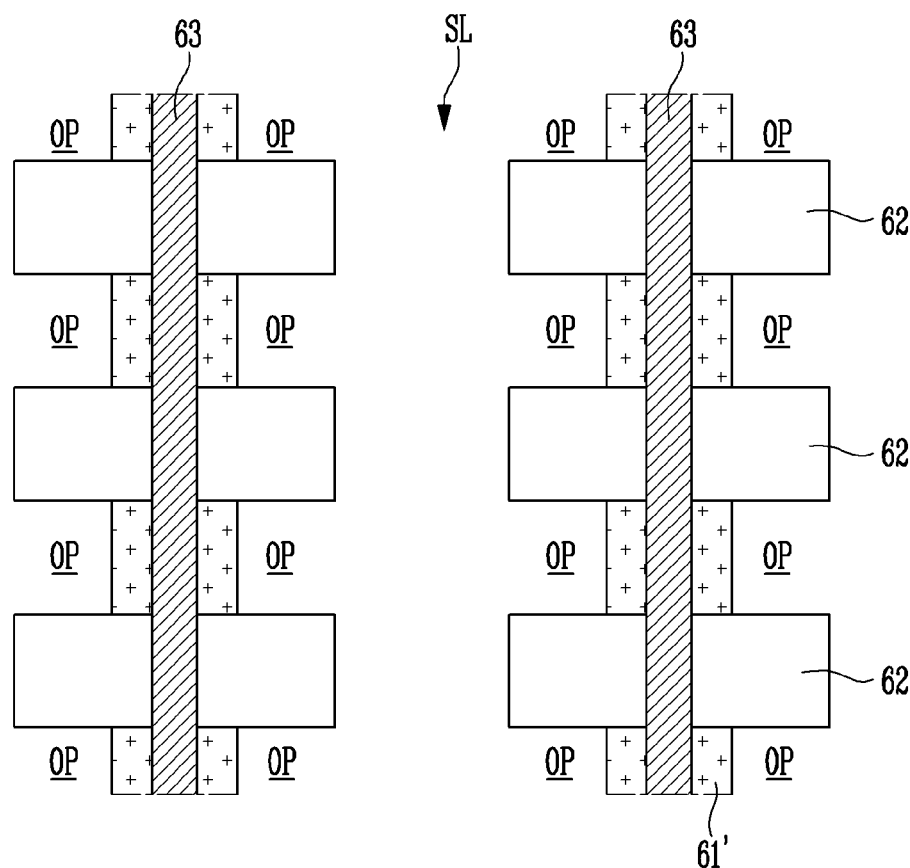
Figure 6C:
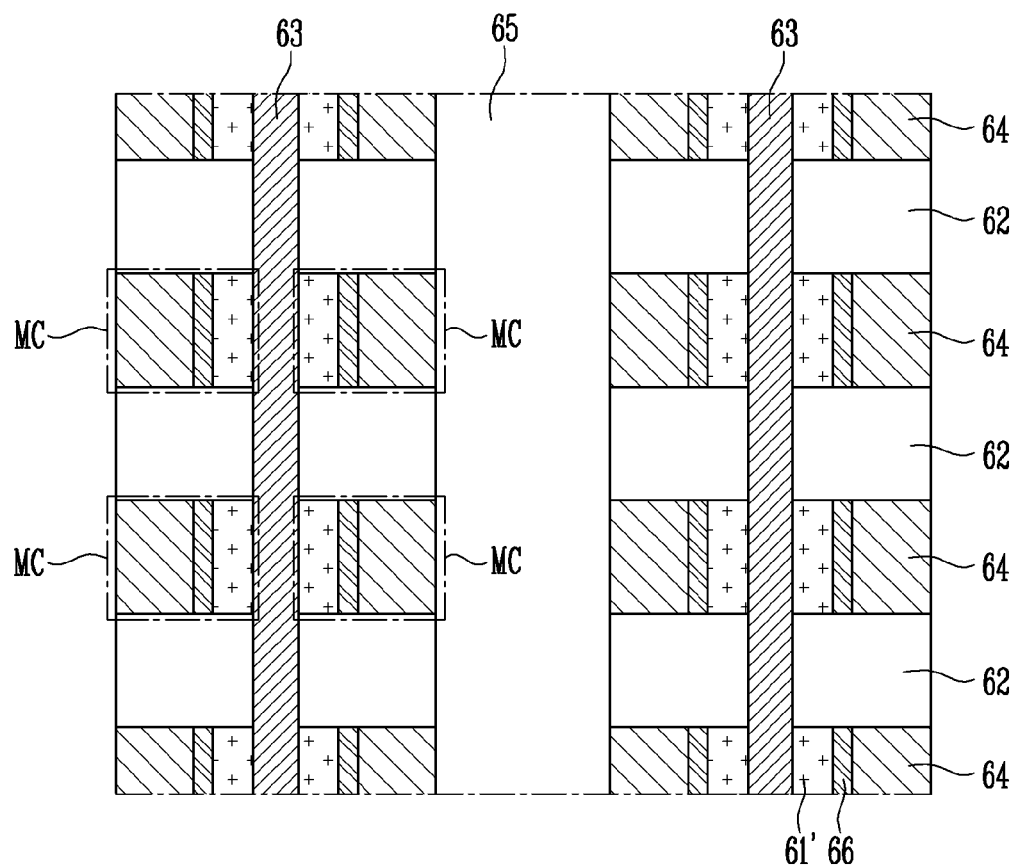

FIGS. 6A, 6B, and 6C are diagrams illustrating a method of manufacturing an electronic device in accordance with an embodiment of the present disclosure. Hereinbelow, repetitive explanation will be omitted for the interest of brevity.

Referring to FIG. 6A, first variable resistance layers 61 and insulating layers 62 may be alternately formed. Thereafter, conductive pillars 63 passing through the first variable resistance layers 61 and the insulating layers 62 may be formed. Thereafter, a slit SL passing through the variable resistance layers 61 and the insulating layers 62 may be formed. The slit SL may be disposed between adjacent conductive pillars 63 and extend in one direction. For example, the slit SL may be disposed between conductive pillars 63 that are adjacent in a second direction (e.g., the horizontal direction in FIG. 6A) and extend in a third direction (e.g., the vertical direction in FIG. 6A) intersecting the second direction. The slit SL may further extend in a first direction that is perpendicular to the plane defined by the second and third directions.

Referring to FIG. 6B, openings OP may be formed by etching the first variable resistance layers 61 through the slit SL. The openings OP may be disposed in substantially the same level as that of the remaining first variable resistance layers 61' and interposed between the insulating layers 62.

Referring to FIG. 6C, second variable resistance layers 66 may be formed in the respective openings OP. The second variable resistance layers 66 may be formed to have a thickness such that the openings OP are not completely filled with the second variable resistance layers 66. For example, the second variable resistance layers 66 may be selectively evaporated on surfaces of the first variable resistance layers 61' through a selective evaporation process.

Thereafter, conductive layers 64 may be formed in the respective openings OP, and then a slit insulating layer 65 may be formed in the slit SL. As a result, memory cells MC may be formed in areas in which the conductive pillars 63 and the conductive layers 64 intersect with each other. Each of the memory cells MC1 and MC2 may include the conductive pillar 63, the first variable resistance layer 61, the second variable resistance layer 66, and the conductive layer 64.

FIGS. 7A, 7B, 7C, and 7D are diagrams illustrating a method of manufacturing an electronic device in accordance with an embodiment of the present disclosure. Hereinbelow, repetitive explanation will be omitted for the interest of brevity.

Figure 7A:
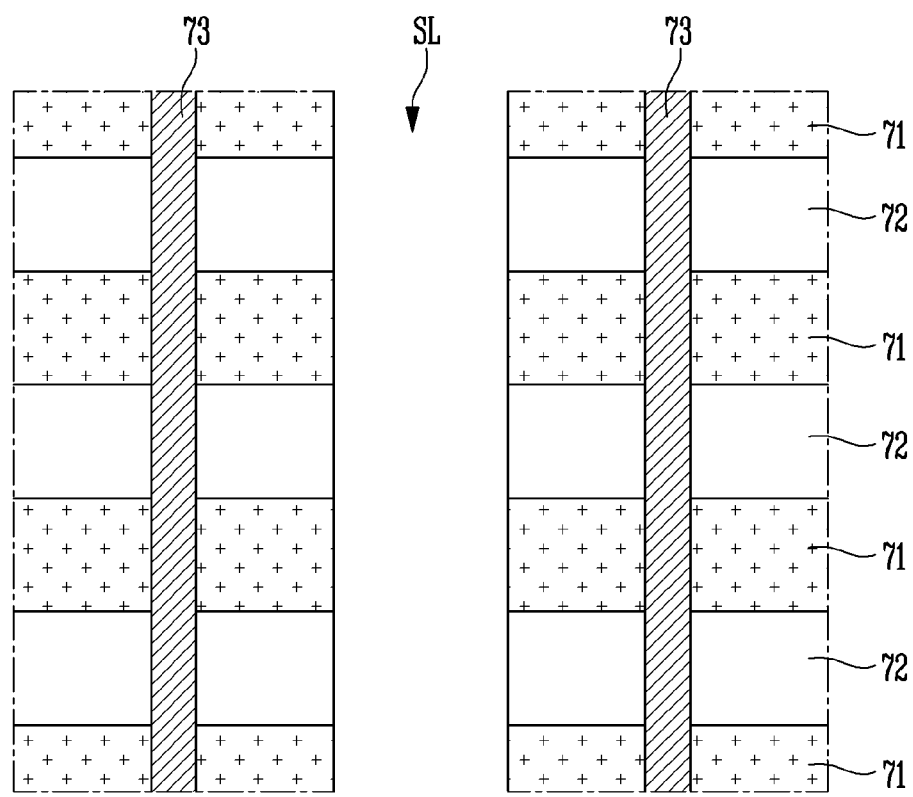
FIGS. 7A, 7B, 7C, and 7D are diagrams illustrating a method of manufacturing an electronic device in accordance with an embodiment of the present disclosure.

Referring to FIG. 7A, first variable resistance layers 71 and insulating layers 72 may be alternately formed. Thereafter, conductive pillars 73 passing through the first variable resistance layers 71 and the insulating layers 72 may be formed. Thereafter, a slit SL passing through the variable resistance layers 71 and the insulating layers 72 may be formed. The slit SL may be disposed between adjacent conductive pillars 73 and extend in one direction. For example, the slit SL may be disposed between conductive pillars 73 that are adjacent in a second direction (e.g., the horizontal direction in FIG. 7A) and extend in a third direction (e.g., the vertical direction in FIG. 7A) intersecting the second direction. The slit SL may further extend in a first direction that is perpendicular to the plane defined by the second and third directions.

Figure 7B:
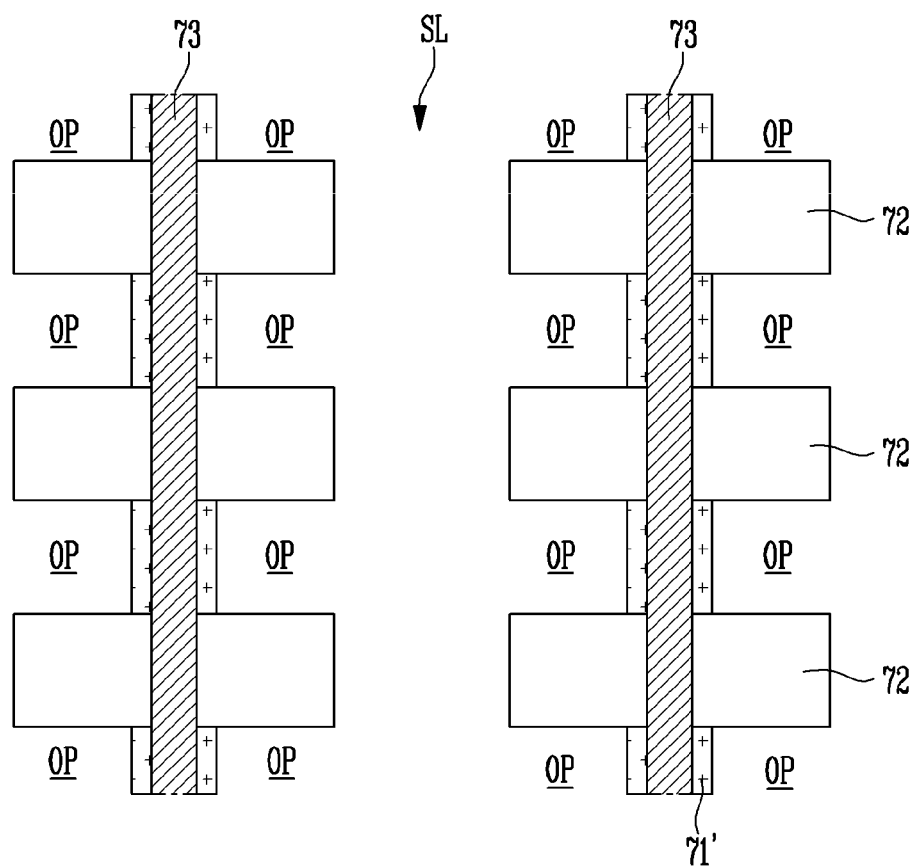

Referring to FIG. 7B, openings OP may be formed by etching the first variable resistance layers 71 through the slit SL. The openings OP may be disposed in substantially the same level as that of the remaining first variable resistance layers 71' and interposed between the insulating layers 72.

Figure 7C:
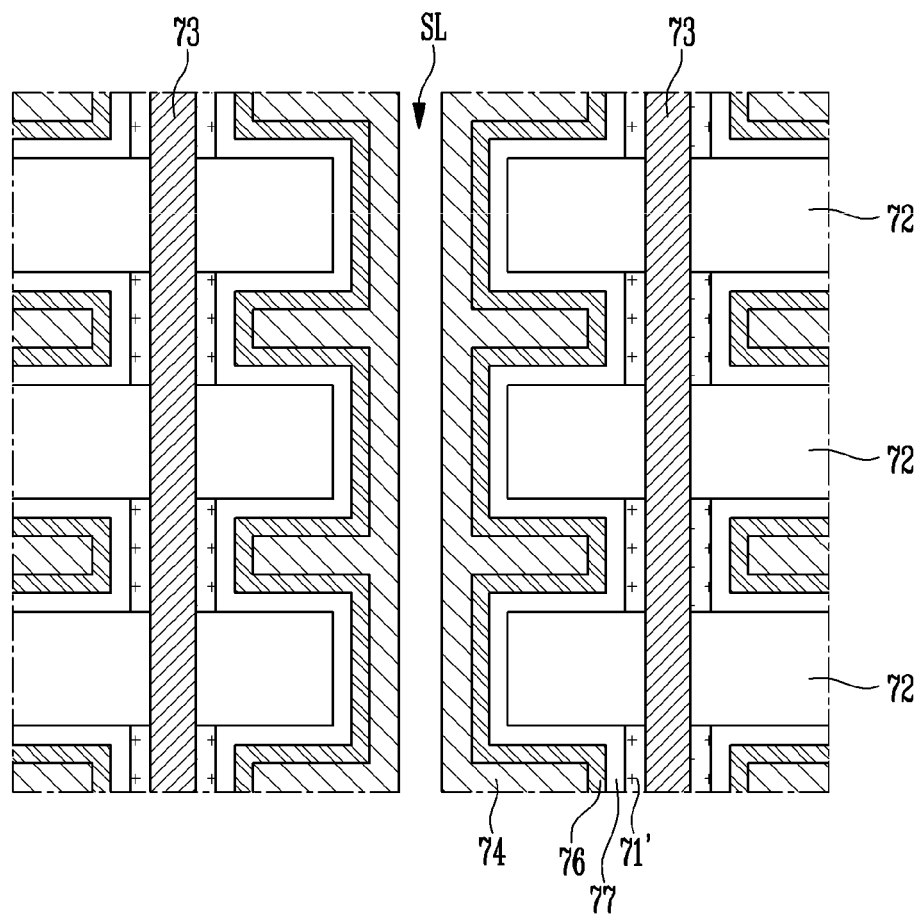

Referring to FIG. 7C, an electrode layer 77, a second variable resistance layer 76, and a conductive layer 74 may be formed. The electrode layer 77 and the second variable resistance layer 76 may be formed along inner surfaces of the openings OP and surfaces of the insulating layers 72. The electrode layer 77 and the second variable resistance layer 76 may be formed to have thicknesses such that the openings OP are not completely filled with the electrode layer 77 and the second variable resistance layer 76. For example, a sum of a thickness of the electrode layer 77 and a thickness of the second variable resistance layer 76 may be smaller than a width of the opening OP in the third direction (e.g., the vertical direction in FIG. 7B). The conductive layer 74 may be formed on the second variable resistance layer 76 and fill the openings OP. Thereby, the electrode layer 77, the second variable resistance layer 76, and the conductive layer 74 may be formed in the openings OP and the slit SL.

Figure 7D:
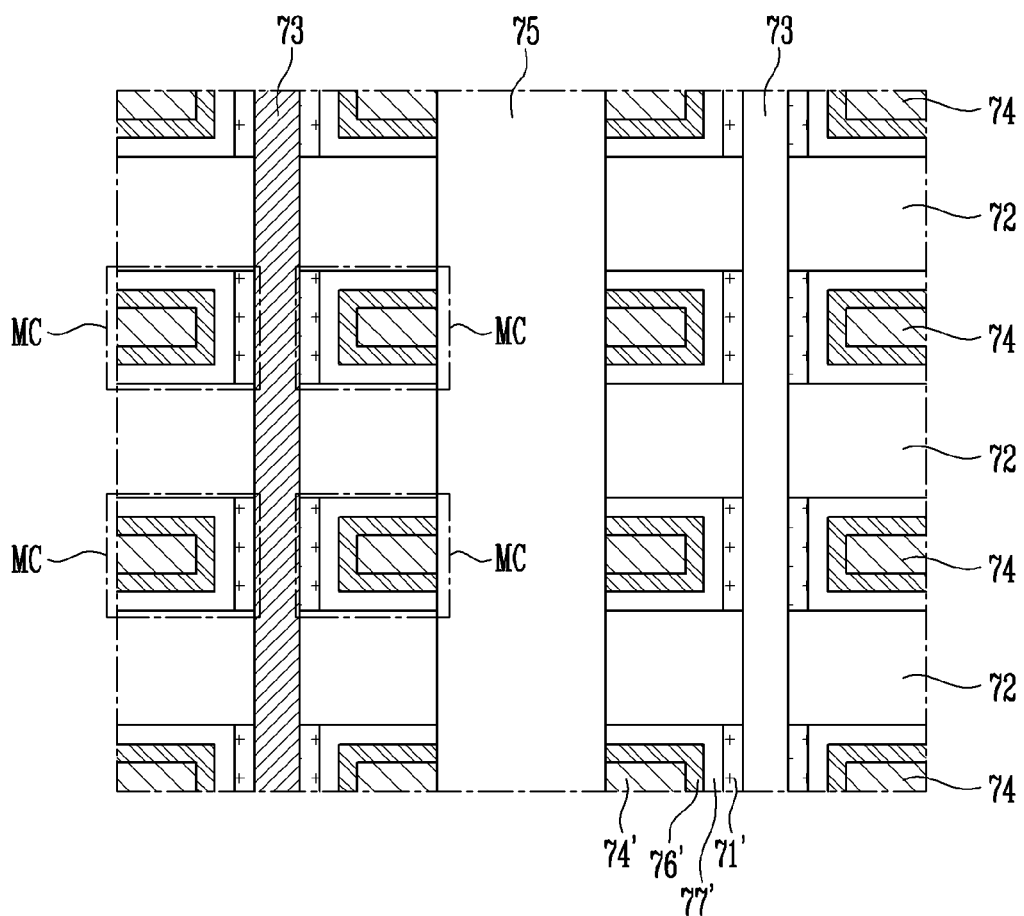

Referring to FIG. 7D, the electrode layer 77, the second variable resistance layer 76, and the conductive layer 74 may be removed from the slit SL. Portions of the electrode layer 77, the second variable resistance layer 76, and the conductive layer 74 may be removed through the slit SL. Thereby, each of the openings OP may be filled with the remaining electrode layer 77, the remaining second variable resistance layer 76, and the remaining conductive layer 74'.

Thereafter, a slit insulating layer 75 may be formed in the slit SL. As a result, memory cells MC may be formed in areas in which the conductive pillars 73 and the conductive layers 74 intersect with each other. Each of the memory cells MC1 and MC2 may include the conductive pillar 73, the first variable resistance layer 71', the electrode layer 77', the second variable resistance layer 76', and the conductive layer 74'.

Figure 8:
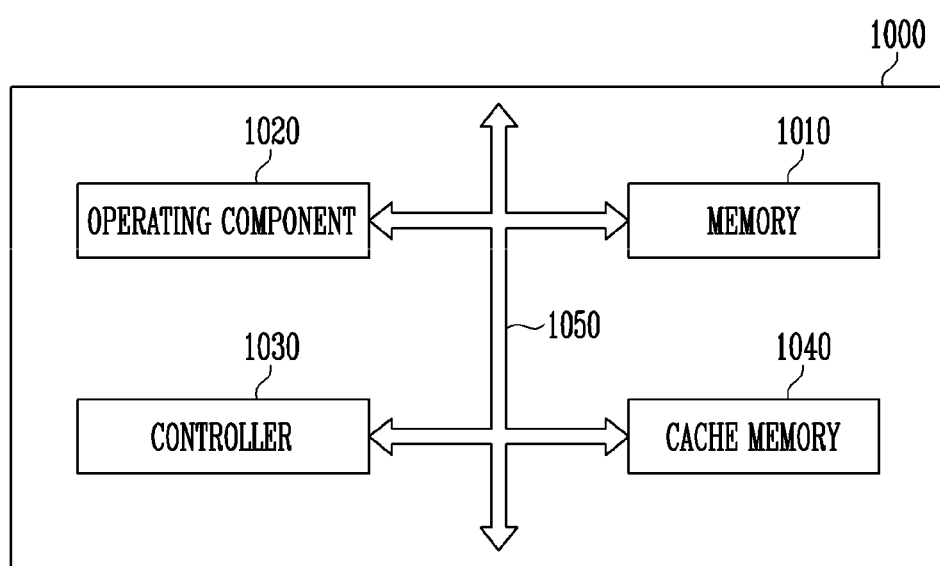
FIG. 8 is a diagram illustrating the configuration of a microprocessor which embodies a memory device in accordance with an embodiment.

FIG. 8 is a diagram illustrating the configuration of a microprocessor 1000 which embodies a memory device in accordance with the embodiment.

Referring to FIG. 8, the microprocessor 1000 may perform tasks for controlling and tuning a series of processes of receiving data from various external devices, processing the data, and outputting processing results to external devices. For example, the microprocessor 1000 may include a memory 1010, an operating component 1020, and a controller 1030.

The microprocessor 1000 may be various data processors such as a central processing unit (CPU), a graphic processing unit (GPU), a digital signal processor (DSP) and an application processor (AP).

The memory 1010 may be a circuit configured to store data in the microprocessor 1000 as a processor register, a register, or the like. For example, the memory 1010 may include a data register, an address register, and a floating point register. In addition, the memory 1010 may include various registers. The memory 1010 may perform the function of temporarily storing data for which operations are to be performed by the operating component 1020, result data of performing the operations, and addresses where data for performing of the operations are stored.

The memory 1010 may include one or more the embodiments of the above-described electronic devices. For example, the memory 1010 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the memory 1010 may be improved. Consequently, the read operation characteristics of the microprocessor 1000 may be improved.

The operating component 1020 may perform various four-arithmetical operations or logical operations based on results of decoding commands by the controller 1030. For example, the operating component 1020 may include at least one arithmetic logic unit (ALU).

The controller 1030 may receive signals from, e.g., the memory 1010, the operating component 1020, and an external device of the microprocessor 1000, perform extraction or decoding of commands, and controlling input and output of signals of the microprocessor 1000, and execute processing represented by programs.

The microprocessor 1000 in accordance to the present embodiment may further include a cache memory 1040 which may temporarily store data to be input from an external device other than the memory 1010 or to be output to an external device. In this case, the cache memory 1040 may exchange data with the memory 1010, the operating component 1020, and the controller 1030 through a bus interface 1050.

Figure 9:
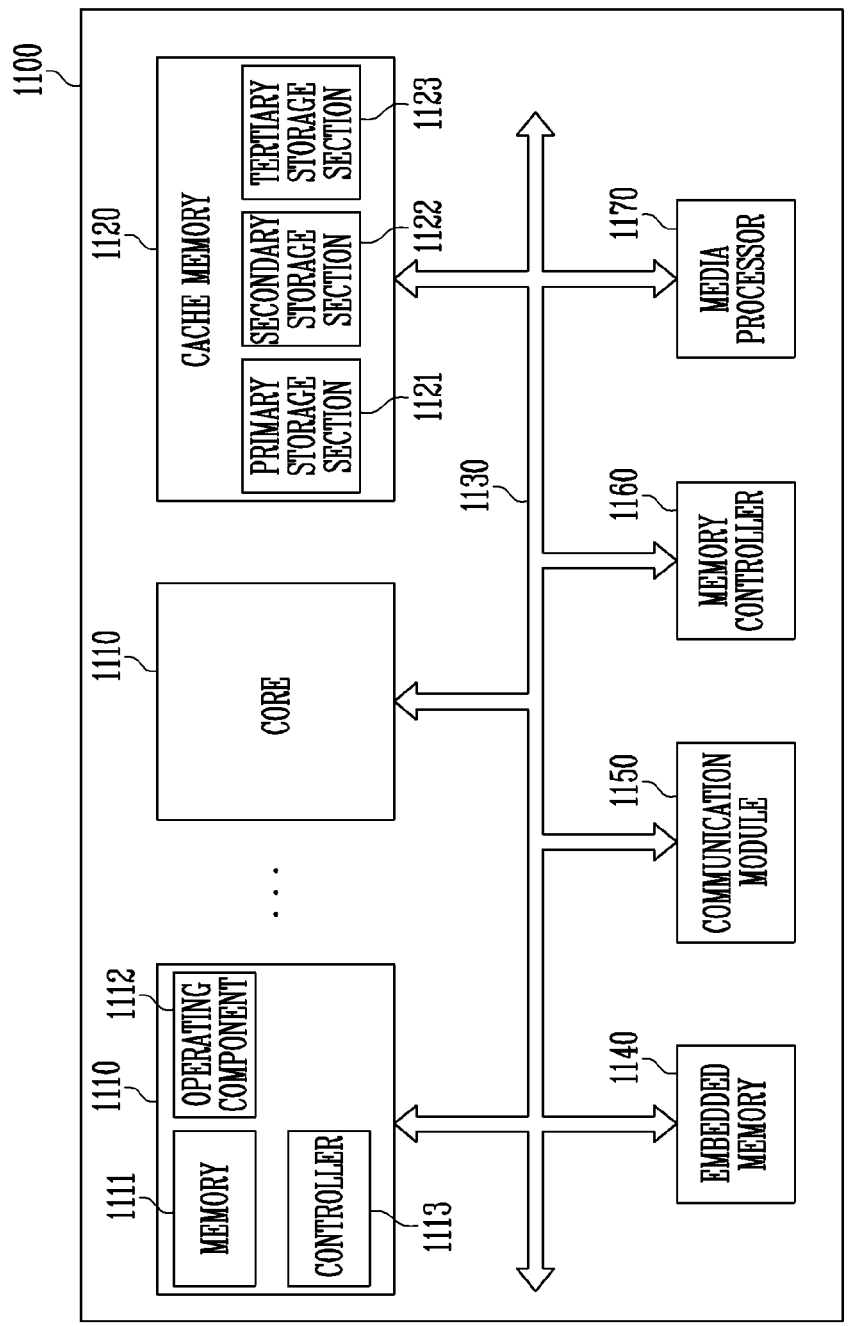
FIG. 9 is a diagram illustrating the configuration of a processor which embodies a memory device in accordance with an embodiment.

FIG. 9 is a diagram illustrating the configuration of a processor 1100 which embodies a memory device in accordance with the embodiment.

Referring to FIG. 9, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core 1110 which functions as a microprocessor, a cache memory 1120 configured to temporarily store data, and a bus interface 1130 configured to transfer data between internal and external devices. The processor 1100 may include various system-on-chips (SoCs) such as a multi-core processor, a graphic processing unit (GPU), and an application processor (AP).

The core 1110 in accordance with the present disclosure may be a circuit which performs arithmetic logic operations for data input from an external device, and may include a memory 1111, an operating component 1112, and a controller 1113.

The memory 1111 may be a circuit configured to store data in the processor 1100 as a processor register, a register, or the like. For example, the memory 1111 may include a data register, an address register, and a floating point register. In addition, the memory 1111 may include various registers. The memory 1111 may perform the function of temporarily storing data for which operations are to be performed by the operating component 1112, result data of performing the operations, and addresses where data for performing of the operations are stored. The operating component 1112 may be a circuit configured to perform operations in the processor 1100, and perform, e.g., various four-arithmetical operations or logical operations, based on results of decoding commands by the controller 1113. For example, the operating component 1112 may include at least one arithmetic logic unit (ALU). The controller 1113 may receive signals from, e.g., the memory 1111, the operating component 1112, and an external device of the processor 1100, perform extraction or decoding of commands, and controlling input and output of signals of the processor 1100, and execute processing represented by programs.

The cache memory 1120 may be a circuit which temporarily stores data to compensate for a difference in data processing speed between the core 1110 operating at a high speed and an external device operating at a low speed. The cache memory 1120 may include a primary storage section 1121, a secondary storage section 1122 and a tertiary storage section 1123. Generally, the cache memory 1120 includes the primary and secondary storage sections 1121 and 1122, and may include the tertiary storage section 1123 in the case where high storage capacity is required. As needed, the number of storage sections included in the cache memory 1120 may be increased. In other words, the number of storage sections included in the cache memory 1120 may be changed depending on design. Here, the speeds at which the primary, secondary and tertiary storage sections 1121, 1122 and 1123 store and discriminate data may be the same or different from each other. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory 1120 may include one or more of the electronic devices in accordance with the above-described embodiments. For example, the cache memory 1120 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the cache memory 1120 may be improved. Consequently, the read operation characteristics of the processor 1100 may be improved.

Although FIG. 9 illustrates that all of the primary, secondary, and tertiary storage sections 1121, 1122 and 1123 are disposed inside the cache memory 1120, all of the primary, secondary and tertiary storage sections 1121, 1122 and 1123 of the cache memory 1120 may be disposed outside the core 1110 and may compensate for a difference in data processing speed between the core 1110 and the external device. Alternatively, the primary storage section 1121 of the cache memory 1120 may be disposed inside the core 1110, and the secondary storage section 1122 and the tertiary storage section 1123 may be disposed outside the core 1110 to reinforce the function of compensating for a difference in data processing speed. As a further alternative, the primary and secondary storage sections 1121 and 1122 may be disposed inside the core 1110 and the tertiary storage section 1123 may be disposed outside the core 1110.

The bus interface 1130 may be a circuit which connects the core 1110, the cache memory 1120 and an external device and enhances data transmission efficiency.

The processor 1100 in accordance with the present embodiment may include a plurality of cores 1110. The plurality of cores 1110 may share the cache memory 1120. The plurality of cores 1110 and the cache memory unit 1120 may be directly connected or be connected through the bus interface 1130. The plurality of cores 1110 may be configured in the same way as the above-described configuration of the core 1110. In the case where the processor 1100 includes the plurality of cores 1110, the primary storage section 1121 of the cache memory 1120 may be configured in each core 1110 based on the number of cores 1110, and the secondary storage section 1122 and the tertiary storage section 1123 may be configured outside the plurality of cores 1110 in such a way as to be shared through the bus interface 1130. Here, the processing speed of the primary storage section 1121 may be higher than that of the secondary or tertiary storage section 1122 or 1123. In an embodiment, the primary storage section 1121 and the secondary storage section 1122 may be configured in each core 1110 based on the number of cores 1110, and the tertiary storage section 1123 may be configured outside the plurality of cores 1110 in such a way as to be shared through the bus interface 1130.

The processor 1100 in accordance with the present embodiment may further include, e.g., an embedded memory 1140 configured to store data, a communication module 1150 configured to transceive data with an external device in a wired or wireless manner, a memory controller 1160 configured to drive an external memory device, and a media processor 1170 configured to process the data processed in the processor 1100 or the data input from an external input device and output the processed data to an external interface device. In addition, the processor 1100 may include a plurality of modules and devices. In this case, the plurality of modules that are additionally provided may exchange data with the cores 1110 and the cache memory 1120 and with one another, through the bus interface 1130.

The embedded memory 1140 may include not only a volatile memory but also a nonvolatile memory. Examples of the volatile memory may include, e.g., a dynamic random access memory (DRAM), a mobile DRAM, a static random access memory (SRAM), and a memory having functions similar to that of the foregoing memories. Examples of the nonvolatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), and a memory having functions similar to that of the foregoing memories.

The communication module 1150 may include a module capable of being connected with a wired network, a module capable of being connected with a wireless network, or both of them. The wired network module may include, e.g., a local area network (LAN), a universal serial bus (USB), an Ethernet, or power line communication (PLC), which is operated in a manner similar to that of various devices configured to transceive data through transfer lines. The wireless network module may include infrared data association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (CDMA), or ultra wideband (UWB), in a manner similar to that of various devices configured to transceive data without a separate transfer line.

The memory controller 1160 may process and manage data which is transmitted between the processor 1100 and external storage devices configured to operate according to different communication standards. The memory controller 1160 may include various memory controllers, for example, controllers which may control integrated device electronics (IDE), serial advanced technology attachment (SATA), small computer system interface (SCSI), redundant array of independent disks (RAID), a solid state disk (SSD), external SATA (eSATA), personal computer memory card international association (PCMCIA), a universal serial bus (USB), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CE) card.

The media processor 1170 may process the data processed in the processor 1100 or the data input in the forms of image, sound, and others from the external input device, and output the data to the external interface device. The media processor 1170 may include, e.g., a graphic processing unit (GPU), a digital signal processor (DSP), a high definition audio device (HD audio), a high definition multimedia interface (HDMI) controller.

Figure 10:
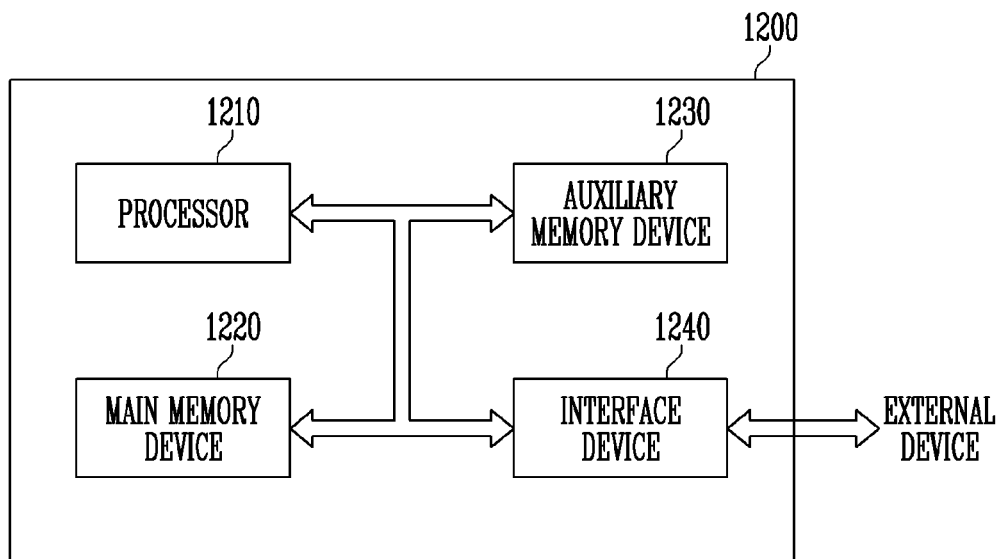
FIG. 10 is a diagram illustrating the configuration of a system which embodies a memory device in accordance with an embodiment.

FIG. 10 is a diagram illustrating the configuration of a system 1200 which embodies a memory device in accordance with the embodiment.

Referring to FIG. 10, the system 1200 may function as a device for processing data and perform input, processing, output, communication, storage, etc. to conduct a series of operations of managing data. The system 1200 may include, e.g., a processor 1210, a main memory device 1220, an auxiliary memory device 1230, and an interface device 1240. Examples of the system 1200 in accordance with the present embodiment may include various electronic systems configured to operate using processors such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual (AV) system, and a smart television.

The processor 1210 may control operations of decoding input commands and processing calculation, comparison, etc. for the data stored in the system 1200. The processor 1210 may include, e.g., a microprocessor unit (MPU), a central processing unit (CPU), a single/multi-core processor, a graphic processing unit (GPU), an application processor (AP), and a digital signal processor (DSP).

The main memory device 1220 may be a memory which can receive, when programs are executed, program codes or data from the auxiliary memory device 1230 and store and execute the program codes or data and can conserve memorized contents even when the power supply is interrupted. The main memory device 1220 may include one or more of the electronic devices in accordance with the above-described embodiments. For example, the main memory device 1220 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the main memory device 1220 may be improved. Consequently, the read operation characteristics of the system 1200 may be improved.

The main memory device 1220 may further include a static random access memory (SRAM), a dynamic random access memory (DRAM), and so on, of a volatile memory type in which all contents are erased when power supply is interrupted. Unlike this, the main memory device 1220 may not include the electronic devices in accordance with the foregoing embodiment, but may include a static random access memory (SRAM), a dynamic random access memory (DRAM), and so on, of a volatile memory type in which all contents are erased when the power supply is interrupted.

The auxiliary memory device 1230 may be a memory device configured to store program codes or data. Although the speed of the auxiliary memory device 1230 is slower than the main memory device 1220, the auxiliary memory device 1230 can store a relatively large amount of data. The auxiliary memory device 1230 may include one or more of the electronic devices in accordance with the above-described embodiments. For example, the auxiliary memory device 1230 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the auxiliary memory device 1230 may be improved. Consequently, the read operation characteristics of the system 1200 may be improved.

Also the auxiliary memory device 1230 may further include, e.g., a data storage system (refer to reference numeral 1300 of FIG. 11) such as a magnetic tape or a magnetic disk using magnetism, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card. Unlike this, the auxiliary memory device 1230 may not include the electronic devices in accordance with the foregoing embodiment, but may further include, e.g., data storage systems (refer to reference numeral 1300 of FIG. 11) such as a magnetic tape or a magnetic disk using magnetism, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card.

The interface device 1240 may perform exchange of commands and data between the system 1200 of the present embodiment and an external device. For example, the interface device 1240 may be a keypad, a keyboard a mouse, a speaker, a mike, a display, various human interface devices (HIDs), or a communication device. The communication device may include a module capable of being connected with a wired network, a module capable of being connected with a wireless network, or both of them. The wired network module may include, e.g., a local area network (LAN), a universal serial bus (USB), an Ethernet, or a power line communication (PLC), which is operated in a manner similar to that of various devices configured to transceive data through transfer lines. The wireless network module may include, e.g., infrared data association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), or ultra wideband (UWB), which is operated in a manner similar to that of various devices configured to transceive data without a separate transfer line.

Figure 11:
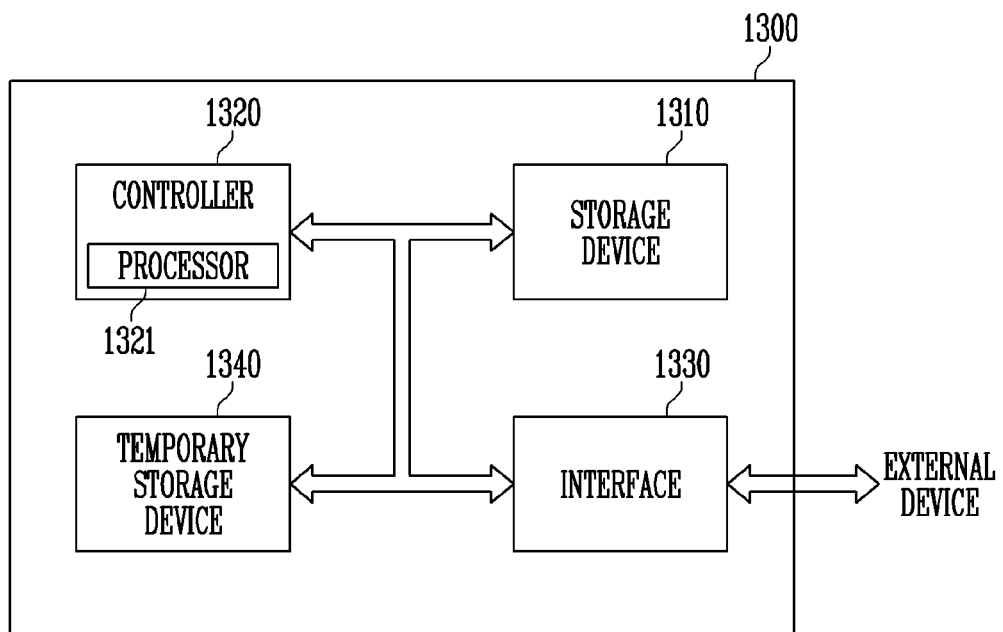
FIG. 11 is a diagram illustrating the configuration of a data storage system which embodies a memory device in accordance with an embodiment.

FIG. 11 is a diagram illustrating the configuration of a data storage system 1300 which embodies a memory device in accordance with the embodiment.

Referring to FIG. 11, the data storage system 1300 may include a storage device 1310 which has a nonvolatile characteristic as a component for storing data, a controller 1320 configured to control the storage device 1310, an interface 1330 for connection with an external device, and a temporary storage device 1340 configured to temporarily store data. The data storage system 1300 may be a disk type such as a hard disk drive (HDD), a compact disc read only memory (CDROM), a digital versatile disc (DVD), or a solid state disk (SSD), or a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The storage device 1310 may include a nonvolatile memory which stores data semi-permanently. Examples of the nonvolatile memory may include a read only memory (ROM), a NOR flash memory, a NAND flash memory, a phase change random access memory (PRAM), a resistive random access memory (RRAM), and a magnetic random access memory (MRAM).

The controller 1320 may control data exchange between the storage device 1310 and the interface 1330. To this end, the controller 1320 may include a processor 1321 for performing, e.g., an operation for processing commands input through the interface 1330 from an external device provided outside the data storage system 1300.

The interface 1330 may perform exchange of commands and data between the data storage system 1300 and an external device. In the case where the data storage system 1300 is a card type system, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), and a compact flash (CF) card, or be compatible with interfaces which are used in devices similar to the foregoing devices. In the case where the data storage system 1300 is a disk type system, the interface 1330 may be compatible with interfaces such as an integrated device electronics (IDE), a serial advanced technology attachment (SATA), a small computer system interface (SCSI), an external SATA (eSATA), a personal computer memory card international association (PCMCIA), and a universal serial bus (USB), or be compatible with the interfaces similar to the foregoing interfaces. The interface 1330 may be compatible with one or more interfaces having different types.

The temporary storage device 1340 may temporarily store data to improve data transfer efficiency between the interface 1330 and the storage device 1310 according to diversifications and high performance of an interface with an external device, a controller and a system. The temporary memory device 1340 may include one or more of the electronic devices in accordance with the foregoing embodiments. For example, the temporary storage device 1340 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the temporary storage device 1340 may be improved. Consequently, the read operation characteristics of the data storage system 1300 may be improved.

Figure 12:
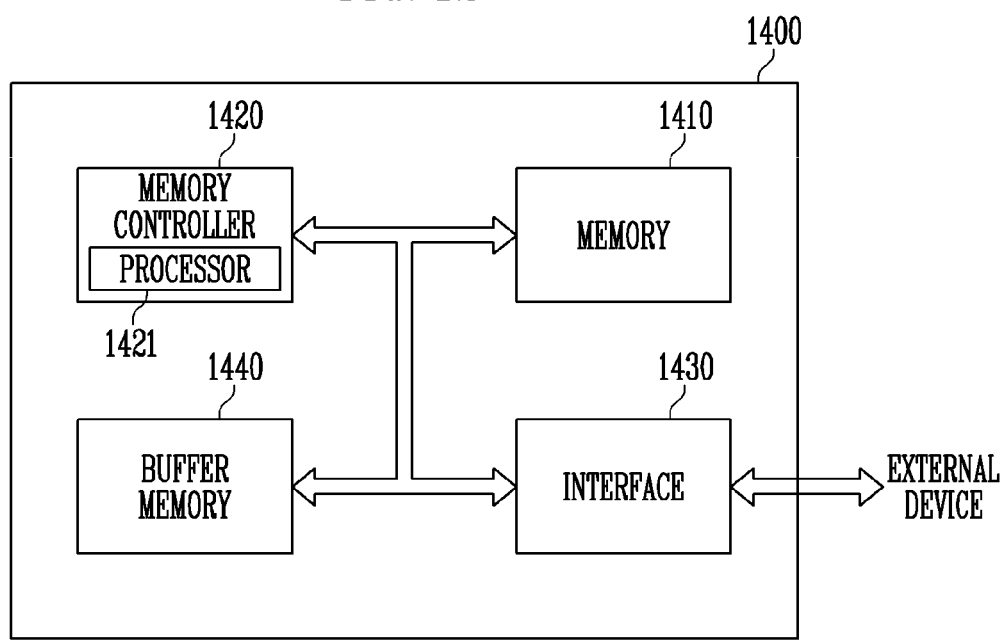
FIG. 12 is a diagram illustrating the configuration of a memory system which embodies a memory device in accordance with an embodiment.

FIG. 12 is a diagram illustrating the configuration of a memory system 1400 which embodies a memory device in accordance with the embodiment.

Referring to FIG. 12, the memory system 1400 may include, e.g., a memory 1410 having nonvolatile characteristics as a component for storing data, a memory controller 1420 configured to control the memory 1410, an interface 1430 for connection with an external device. Also the auxiliary memory device 1400 may be a card type system such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), or a compact flash (CF) card.

The memory 1410 configured to store data may include one or more of the electronic devices in accordance with the foregoing embodiments. For example, the memory 1410 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Thereby, read performance characteristics of the memory 1410 may be improved. Consequently, the read operation characteristics of the memory system 1400 may be improved.

Examples of the nonvolatile memory in accordance with the present embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. To this end, the memory controller 1420 may include a processor 1421 for performing, e.g., an operation for processing commands input through the interface 1430 from an external device provided outside the data storage system 1400.

The interface 1430 may perform exchange of commands and data between the memory system 1400 and the external device. The interface 1430 may be compatible with interfaces which are used in devices, such as a universal serial bus (USB) memory, a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, or be compatible with interfaces which are used in devices similar to the foregoing devices. The interface 1430 may be compatible with one or more interfaces having different types.

The memory system 1400 in accordance with the present embodiment may further include a buffer memory 1440 for improving data transfer efficiency between the interface 1430 and the memory 1410 according to diversification and high performance of an interface with an external device, a memory controller, and a memory system. The buffer memory 1440 configured to temporarily store data may include one or more of the electronic devices in accordance with the foregoing embodiments. For example, the buffer memory 1440 may include: variable resistance layers and insulating layers which are alternately stacked; conductive pillars which pass through the variable resistance layers and the insulating layers; a slit insulating layer which passes through the insulating layers and extends in the first direction; and conductive layers interposed between the slit insulating layer and the variable resistance layers. The variable resistance layers may retain an amorphous state during a program operation. Consequently, the read operation characteristics of the memory system 1400 may be improved.

In addition, examples of the buffer memory 1440 in accordance with the present embodiment may further include, e.g., a static random access memory (SRAM), and a dynamic random access memory (DRAM), which have a volatile characteristic, and a phase change random access memory (PRAM), a resistive random access memory (RRAM), a spin transfer torque random access memory (STTRAM), and a magnetic random access memory (MRAM), which have a nonvolatile characteristic. Unlike this, examples of the buffer memory 1440 may not include the electronic device in accordance with the foregoing embodiment, but may further include, e.g., a static random access memory (SRAM), and a dynamic random access memory (DRAM), which have a volatile characteristic, and a phase change random access memory (PRAM), a resistive random access memory (RRAM), a spin transfer torque random access memory (STTRAM), and a magnetic random access memory (MRAM), which have a nonvolatile characteristic.

Various embodiments of the present disclosure may provide an electronic device having improved operating characteristics and reliability of memory cells.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An electronic device comprising a semiconductor memory, the semiconductor memory comprising:
    variable resistance layers and insulating layers alternately stacked;
    conductive pillars passing through the variable resistance layers and the insulating layers;
    a slit insulating layer vertically passing through the insulating layers and extending in a first direction, the slit insulating layer being disposed in parallel to the insulating layers in a second direction perpendicular to the first direction; and
    conductive layers disposed in parallel to each other in the second direction and interposed between the slit insulating layer and the variable resistance layers,
    wherein the variable resistance layers remain in an amorphous state during a program operation.

2. The electronic device according to claim 1, wherein each of the insulating layers comprises protrusions protruding compared to a corresponding one of the variable resistance layers in a cross-sectional view, and the conductive layers are alternately stacked with the protrusions.

3. The electronic device according to claim 1, wherein each of the variable resistance layers encloses sidewalls of the conductive pillars and extends in the first direction.

4. The electronic device according to claim 1, wherein a portion of each of the variable resistance layers is interposed between a pair of the conductive pillars disposed adjacent to each other in the first direction.

5. The electronic device according to claim 1, wherein each of the variable resistance layers is interposed between a pair of the conductive layers disposed adjacent to each other in the second direction.

6. The electronic device according to claim 1, wherein the variable resistance layers include amorphous chalcogenide.

7. The electronic device according to claim 1, wherein memory cells are disposed in respective areas in which the conductive pillars intersect with the conductive layers.

8. The electronic device according to claim 1, further comprising phase-change layers interposed between the variable resistance layers and the conductive layers, respectively.

9. The electronic device according to claim 1, wherein the slit insulating layer and each of the insulating layers are arranged in the second direction.

10. The electronic device according to claim 1, wherein the variable resistance layers and the insulating layers vertically stacked.

11. An electronic device comprising a semiconductor memory, the semiconductor memory comprising:
    insulating layers stacked;
    first variable resistance layers alternately stacked with the insulating layers and each extending in a first direction;
    vertical bit lines passing through the first variable resistance layers and the insulating layers;
    a first slit insulating layer vertically passing through the insulating layers and extending in the first direction, the first slit insulating layer being disposed in parallel to the insulating layers in a second direction perpendicular to the first direction;
    a second slit insulating layer vertically passing through the insulating layers and extending in the first direction, the second slit insulating layer being disposed in parallel to the insulating layers in the second direction;
    first word lines disposed in parallel to each other in the second direction, each of the first word lines being interposed between the first slit insulating layer and each of the first variable resistance layers; and
    second word lines disposed in parallel to each other in the second direction, each of the second word lines being interposed between the second slit insulating layer and each of the first variable resistance layers,
    wherein first memory cells are respectively disposed between the vertical bit lines and the first word lines, second memory cells are respectively disposed between the vertical bit lines and the second word lines, and each of the first memory cells and each of the second memory cells are disposed adjacent in the second direction and share a corresponding one of the first variable resistance layers.

12. The electronic device according to claim 11, wherein a portion of each of the first variable resistance layers fills spaces defined between a pair of the vertical bit lines disposed adjacent to each other in the first direction.

13. The electronic device according to claim 11, wherein the first variable resistance layers remain in an amorphous state during a program operation.

14. The electronic device according to claim 11, further comprising second variable resistance layers including a first plurality of second variable resistance layers and a second plurality of second variable resistance layers, the first plurality of second variable resistance layers being respectively interposed between the first variable resistance layers and the first word lines, the second plurality of second variable resistance layers being respectively disposed between the first variable resistance layers and the second word lines.

15. The electronic device according to claim 14, further comprising electrode layers interposed between the first variable resistance layers and the second variable resistance layers.

16. The electronic device according to claim 14, wherein, during a program operation, the first variable resistance layers remain in an amorphous state, and the second variable resistance layers change in phase.

17. The electronic device according to claim 14, wherein each of the first memory cells includes a corresponding one of the first plurality of second variable resistance layers and each of the second memory cells includes a corresponding one of the second plurality of second variable resistance layers.

18. The electronic device according to claim 11, wherein the insulating layers are vertically stacked.

* * * * *

UNITED STATES PATENT AND TRADEMARK OFFICE
CERTIFICATE OF CORRECTION

PATENT NO. : 11,362,139 B2  
APPLICATION NO. : 16/903908  
DATED : June 14, 2022  
INVENTOR(S) : Si Jung Yoo Page 1 of 1

It is certified that error appears in the above-identified patent and that said Letters Patent is hereby corrected as shown below:

On the Title Page

Item (54) and In the Specification, Column 1, Lines 1-2, title section, cancel the text "ELECTRONIC DEVICE AND METHOD OF MANUFACTURING THE SAME" and insert --ELECTRONIC DEVICE WITH VARIABLE RESISTANCE LAYERS AND INSULATING LAYERS ALTERNATELY STACKED AND METHOD OF MANUFACTURING THE SAME--.

Signed and Sealed this  
Thirtieth Day of August, 2022

Katherine Kelly Vidal  
*Director of the United States Patent and Trademark Office*